(12) United States Patent
Chylak et al.

(10) Patent No.: US 9,779,965 B2
(45) Date of Patent: Oct. 3, 2017

(54) SYSTEMS AND METHODS FOR BONDING SEMICONDUCTOR ELEMENTS

(71) Applicant: Kulicke and Soffa Industries, Inc., Fort Washington, PA (US)

(72) Inventors: Robert N. Chylak, Newtown, PA (US); Dominick A. DeAngelis, Villanova, PA (US); Horst Clauberg, Warwick, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 15/456,767

(22) Filed: Mar. 13, 2017

(65) Prior Publication Data

US 2017/0186627 A1    Jun. 29, 2017

Related U.S. Application Data

(60) Continuation-in-part of application No. 15/147,015, filed on May 5, 2016, now Pat. No. 9,633,981, which (Continued)

(51) Int. Cl.
*H01L 21/449* (2006.01)
*H01L 23/00* (2006.01)
(Continued)

(52) U.S. Cl.
CPC ...... *H01L 21/449* (2013.01); *H01L 21/76251* (2013.01); *H01L 24/11* (2013.01); *H01L 24/17* (2013.01); *H01L 24/75* (2013.01); *H01L 24/81* (2013.01); *H01L 25/0657* (2013.01); *H01L 25/50* (2013.01); *H01L 2021/60195* (2013.01)

(58) Field of Classification Search
CPC . H01L 2224/11003; H01L 2224/11334; H01L 24/11; H01L 21/561; H01L 2021/60195; H01L 21/76251; H01L 2224/85205; H01L 2224/85053; H01L 2224/84205; H01L 2224/83205;
(Continued)

(56) References Cited

U.S. PATENT DOCUMENTS 5,880,010 A    3/1999  Davidson
6,352,743 B1   3/2002  Ellis et al.
(Continued)

FOREIGN PATENT DOCUMENTS

CN    202394859    8/2012
TW    I279887      4/2007
(Continued)

*Primary Examiner* — Jasmine Clark
(74) *Attorney, Agent, or Firm* — Stradley Ronon Stevens & Young, LLP

(57) ABSTRACT

A method of ultrasonically bonding semiconductor elements includes the steps of: (a) aligning surfaces of a plurality of first conductive structures of a first semiconductor element to respective surfaces of a plurality of second conductive structures of a second semiconductor element; and (b) ultrasonically bonding ones of the first conductive structures to respective ones of the second conductive structures. A bonding surface of at least one of the first conductive structures and the second conductive structures includes a frangible coating.

25 Claims, 18 Drawing Sheets

Related U.S. Application Data is a division of application No. 14/822,164, filed on Aug. 10, 2015, now Pat. No. 9,362,247, which is a continuation of application No. 14/505,609, filed on Oct. 3, 2014, now Pat. No. 9,136,240.

(60) Provisional application No. 61/888,203, filed on Oct. 8, 2013.

(51) Int. Cl.
*H01L 25/00* (2006.01)
*H01L 25/065* (2006.01)
*H01L 21/762* (2006.01)
*H01L 21/60* (2006.01)

(58) Field of Classification Search
CPC ....... H01L 21/449; H01L 24/17; H01L 24/81; H01L 25/50; H01L 25/0657; H01L 24/75
See application file for complete search history.

(56) References Cited

U.S. PATENT DOCUMENTS

| | | | |
|---|---|---|---|
| 7,501,707 | B2 | 3/2009 | Morishita et al. |
| 7,566,586 | B2 | 7/2009 | Kainuma et al. |
| 2004/0121576 | A1* | 6/2004 | Su .................... H01L 24/11 438/613 |
| 2004/0157407 | A1* | 8/2004 | Tong ................. B23K 20/02 438/455 |
| 2004/0214406 | A1 | 10/2004 | Kurita et al. |
| 2010/0007001 | A1 | 1/2010 | Wang et al. |
| 2010/0133671 | A1 | 6/2010 | Tzu |
| 2011/0045653 | A1* | 2/2011 | Ohno ................. H01L 24/75 438/455 |

FOREIGN PATENT DOCUMENTS

| | | |
|---|---|---|
| TW | 200746332 | 12/2007 |
| TW | 201023305 | 6/2010 |

\* cited by examiner

SYSTEMS AND METHODS FOR BONDING SEMICONDUCTOR ELEMENTS

CROSS-REFERENCE TO RELATED APPLICATION

This application is a continuation-in-part application of application Ser. No. 15/147,015, filed May 5, 2016, now U.S. Pat. No. 9,633,981, which is a divisional application of application Ser. No. 14/822,164, filed Aug. 10, 2015, now U.S. Pat. No. 9,362,247, which is a continuation application of application Ser. No. 14/505,609 filed Oct. 3, 2014, now U.S. Pat. No. 9,136,240, which claims the benefit of Provisional Application No. 61/888,203, filed Oct. 8, 2013, the content of each of which is incorporated herein by reference.

FIELD

The present invention relates to the formation of semiconductor packages, and more particularly, to improved systems and methods for bonding semiconductor elements together.

BACKGROUND

Traditional semiconductor packaging typically involves die attach processes and wire bonding processes. Advanced semiconductor packaging technologies (e.g., flip chip bonding, thermo-compression bonding, etc.) technologies are gaining more traction in this industry. For example, in thermo-compression bonding, heat and pressure are used to form a plurality of interconnections between semiconductor elements.

While advanced packaging technologies are increasingly utilized there are many limitations in these technologies including, for example, limitations related to the relative infancy of some advanced packaging technologies. Thus, it would be desirable to provide improved systems for, and methods of, bonding semiconductor elements together.

SUMMARY

According to an exemplary embodiment of the invention, a method of ultrasonically bonding semiconductor elements is provided. The method includes the steps of: (a) aligning surfaces of a plurality of first conductive structures of a first semiconductor element to respective surfaces of a plurality of second conductive structures of a second semiconductor element; and (b) ultrasonically bonding ones of the first conductive structures to respective ones of the second conductive structures. Prior to step (b), a bonding surface of at least one of the first conductive structures and the second conductive structures includes a frangible coating.

For example, the frangible coating on the conductive structures of at least one of the first semiconductor element and the second semiconductor element may be applied before flip chip bonding to protect the bonding surface of the conductive structures from oxidation (e.g., where the conductive structures may be formed of, or include, copper). The coating may be a surface layer of a nitride, oxide or carbide of silicon, or a mixture thereof, having a thickness that is suitable for bonding without fluxing and that is sufficiently frangible under ultrasonic bonding to obtain metal-to-metal contact between the conductive structures of the first semiconductor element and the second semiconductor element. An exemplary range of the thickness of the coating is between 10 Angstroms and 500 Angstroms, with another exemplary range being between 15 Angstroms and 250 Angstroms. The coating may be, for example, a nitride, oxide or carbide of Ti, Ta, In, Al, Sn, Zn, Zr, V, Cr, Ni.

Ceramic coatings may be utilized that are sufficiently frangible to obtain metal-to-metal contact between the bonding surface of the respective conductive structures during ultrasonic flip chip bonding, and to obtain a surface suitable for bonding without fluxing.

That is, a method is provided for protecting from contaminants (such as copper oxides), or removing contaminants from, the bonding surface of conductive structures (e.g., copper conductive structures) for flip chip bonding including ultrasonic joining. The method includes coating the bonding surface with a layer of a ceramic material having a thickness that is suitable for bonding without fluxing and that provides the layer with a hardness that is sufficiently frangible during flip chip bonding to obtain metal-to-metal contact between the bonding surfaces of the conductive structures.

The coating of the conductive structures may be a surface layer coatings of rare earth metals that form complexes with copper (e.g., if the conductive structure including the coating is copper). The coating may have a thickness that, upon formation of the copper complex (e.g., and exposure to a reducing environment containing hydrogen), forms a ceramic hydride layer (e.g., a layer of a metal hydride compound selected from metal hydrides of copper-rare earth metal complexes and metal hydrides of copper-immiscible metals that form metal hydrides) having a thickness that is suitable for bonding without fluxing and which provides the layer with the aforementioned hardness.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

In accordance with certain exemplary embodiments of the present invention, inventive techniques (and structures) are provided for assembling a semconductor device such as a package on package (i.e., PoP) structure. For example, a plurality of semiconductor elements (which may be packages) may be arranged in a stacked configuration. Each of the elements desirably includes aluminum (or aluminum alloy, or partially aluminum) conductive structures that are ultrasonically bonded together. Such a technique has certain advantages including, for example: a reduced density compared to other interconnection techniques (e.g., solder based PoP techniques); no solder mass reflow utilized in contrast to other interconnection techniques; and room temperature ultrasonic bonding enabled in certain applications through the use of an aluminum to aluminum interconnect.

Figure 1A:
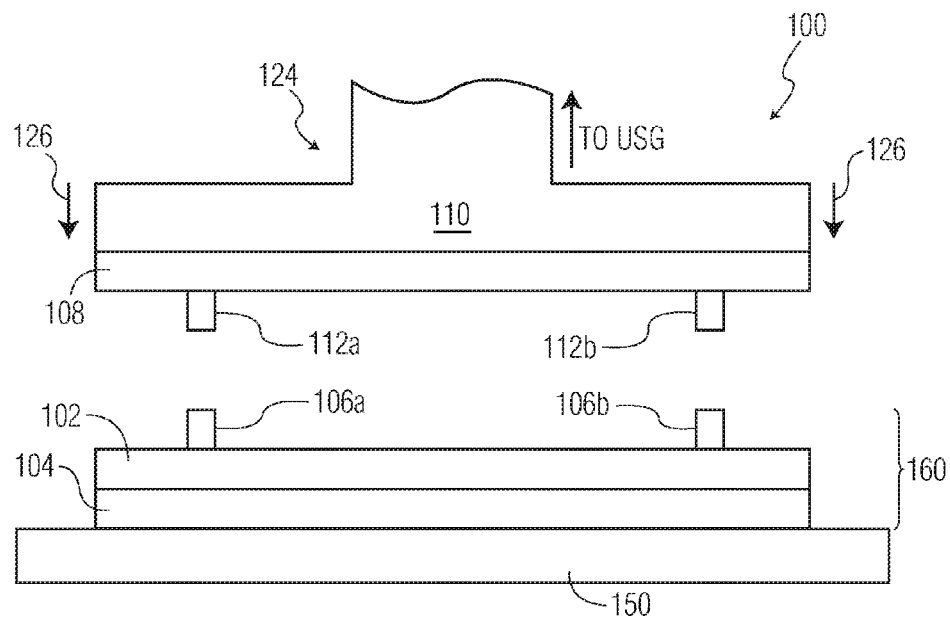
FIGS. 1A-1C are block diagram views of portions of an ultrasonic bonding machine illustrating a structure and method of bonding an upper semiconductor element to a lower semiconductor element in accordance with an exemplary embodiment of the invention.

FIG. 1A illustrates portions of ultrasonic bonding machine 100, including bonding tool 124 and support structure 150. As will be appreciated by those skilled in the art, a thermo-compression bonding machine (such as machine 100, or any of the other machine embodiments described herein) may include many elements not shown in the drawings herein for simplicity. Exemplary elements includes, for example: input elements for providing input workpieces to be bonded with additional semiconductor elements; output elements for receiving processed workpieces that now include additional semiconductor elements; transport systems for moving workpieces; imaging systems for imaging and alignment of workpieces; a bond head assembly carrying the bonding tool; a motion system for moving the bond head assembly; a computer system including software for operating the machine; amongst other elements.

Figure 1B:
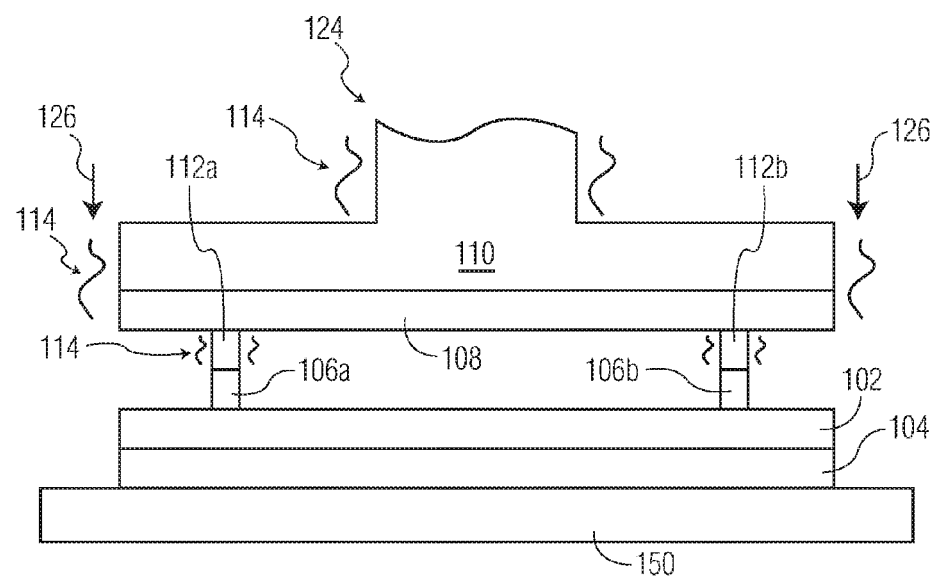

Referring again to FIG. 1A, upper semiconductor element 108 is retained (e.g., by vacuum, such as through vacuum ports defined by the holding surface of holding portion 110) by holding portion 110 of bonding tool 124. Upper semiconductor element 108 includes upper conductive structures 112a, 112b on a lower surface thereof. Lower semiconductor element 160 includes semiconductor die 102 bonded to (or otherwise supported by) substrate 104. Lower conductive structures 106a, 106b are provided on an upper surface of lower semiconductor die 102. Substrate 104 in turn is supported by support structure 150 (e.g., a heat block of machine 100, an anvil of machine 100, or any other desired support structure). In the configuration shown in FIG. 1A (preparing for bonding), each of upper conductive structures 112a, 112b are generally aligned with opposing respective lower conductive structures 106a, 106b. Semiconductor element 108 is moved downward through the motion of bonding tool 124 (as shown by the arrows 126 in FIG. 1A). Following this motion, FIG. 1B illustrates contact between the respective conductive structures 106a, 112a and 106b, 112b. Ultrasonic energy 114 is applied to upper semiconductor element 108 and upper conductive structures 112a, 112b through bonding tool 124 using an ultrasonic transducer (not shown but indicated in the drawings as "USG", that is, ultrasonic generator). For example, an ultrasonic transducer that carries bonding tool 124 may in turn be carried by a bond head assembly of machine 100.

During the ultrasonic bonding, lower conductive structures 106a, 106b may be held relatively stationary through the support of lower semiconductor element 160 by support structure 150 (e.g., a support surface of support structure 150 may include one or more vacuum ports to secure substrate 104 to support structure 150 during bonding). Ultrasonic energy 114 (along with optional bond force and/or heat) may cause partial deformation of the conductive structures. For example, conductive structures 106a, 106b and 112a, 112b are illustrated as being partially deformed in FIG. 1C. Ultrasonic bonds are formed between respective pairs of conductive structures in FIG. 1C. For example, ultrasonic bond 128a is formed between deformed conductive structures 112a'/106a', and ultrasonic bond 128b is formed between deformed conductive structures 112b'/106b'. Conductive structures 106a, 106b; 112a, 112b may be formed of aluminum, or aluminum alloys, or may contain aluminum at their bond surfaces, etc.

The respective pairs of conductive elements 106a, 112a; 106b, 112b may be bonded together at room temperature (without heat being added during the bonding process). Optionally, additional heat may be applied, for example, to: (1) upper semiconductor element 108 through bonding tool 124, thus heating upper conductive elements 112a, 112b during the bonding process; and/or (2) lower semiconductor element 160 through support structure 150 (e.g., heat block 150), thus heating lower conductive structures 106a, 106b during the bonding process. Such optional heating (e.g., through the bond tool and/or the support structure, etc.) is applicable to any of the embodiments of the present invention illustrated and described herein.

Figure 1C:
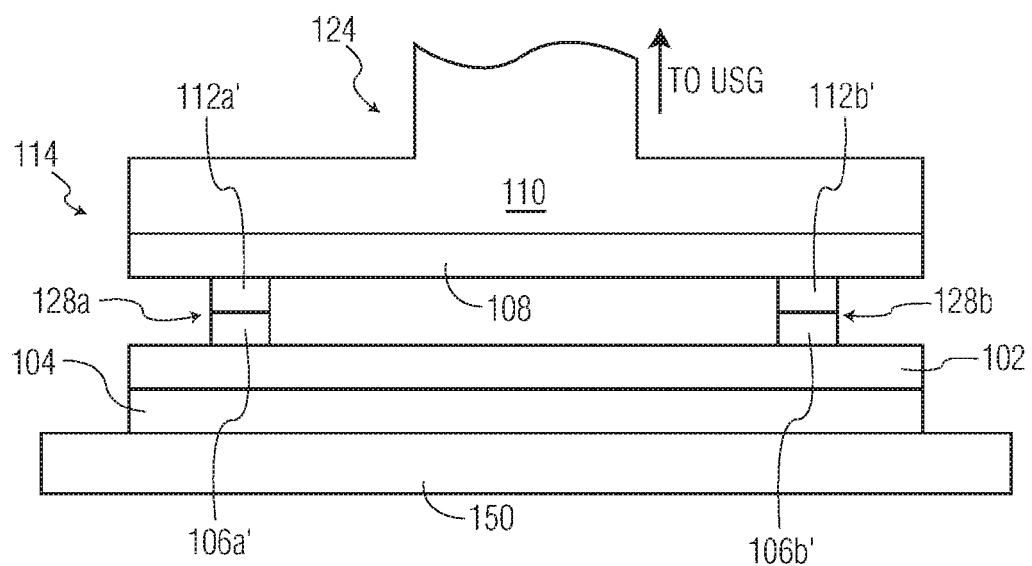

Semiconductor elements 160 and 108 illustrated in FIGS. 1A-1C may be any of a number of semiconductor elements configured to be bonded together. In one very specific example (which may also be applied to the other embodiments illustrated and described herein) semiconductor element 160 is a processor (e.g., a mobile phone processor which may also be known as an APU (application processor unit)) and semiconductor element 108 is a memory device configured to be bonded to the processor as shown in FIGS. 1A-1C.

The conductive structures (i.e., 112a, 112b, 106a, 106b) shown in FIGS. 1A-1C are illustrated as generic structures. These structures may take many different forms such as conductive pillars, stud bumps (e.g., formed using a stud bumping machine), electroplated conductive structures, sputtered conductive structures, wire portions, bond pads, contact pads, among many others. Various of the other drawings provided herein illustrate specific examples of such structures. In accordance with certain embodiments of the present invention the conductive structures include aluminum at the contact region (i.e., the bonding surface) where they will be bonded to another conductive structure. In such embodiments, the conductive structures may be formed of aluminum, or an aluminum alloy (e.g., aluminum alloyed with copper, aluminum alloyed with silicon and copper, etc.). In other examples, the conductive structures may include a base conductive material other than aluminum (e.g., copper) with aluminum (or aluminum alloy) at the contact region. Throughout the present application, if a conductive structure is referred to as being "aluminum" it is understood that the structure may be aluminum, may be an aluminum alloy, or may include aluminum (or an aluminum alloy) at a contact region of such conductive structure.

Figure 2A:
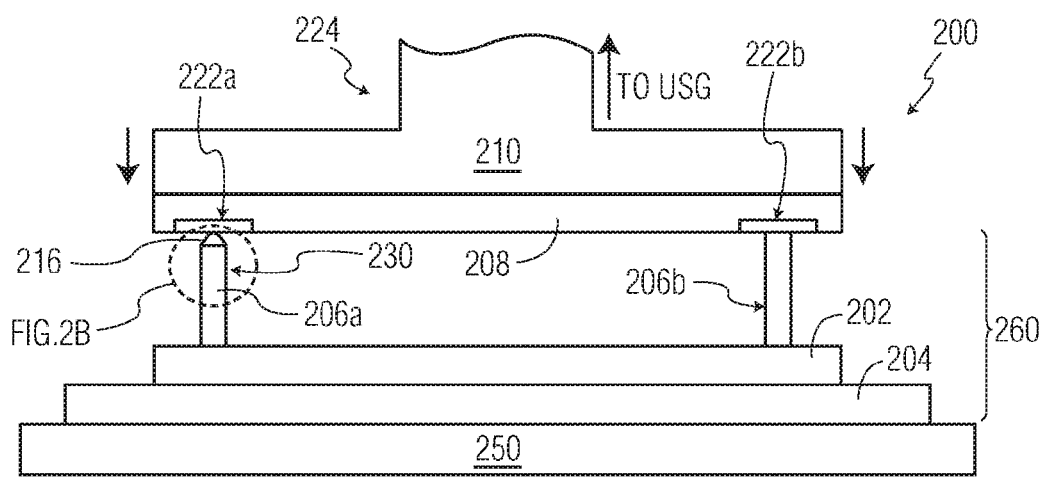
FIG. 2A is a block diagram view of portions of an ultrasonic bonding machine illustrating a structure and method of bonding an upper semiconductor element to a lower semiconductor element in accordance with another exemplary embodiment of the invention.
Figure 2B:
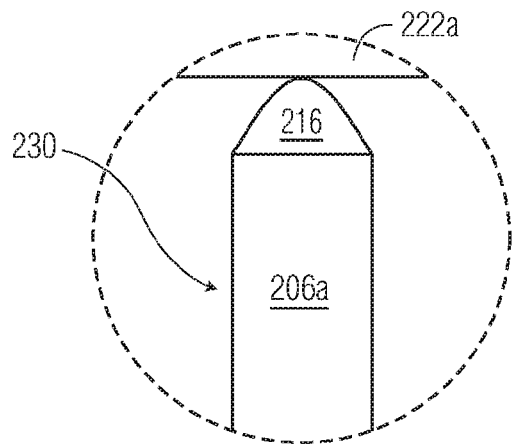
FIG. 2B is an enlarged view of portion "FIG. 2B" of FIG. 2A.

FIG. 2A illustrates portions of ultrasonic bonding machine 200, including bonding tool 224 and support structure 250. Upper semiconductor element 208 is retained (e.g., by vacuum) by holding portion 210 of bonding tool 224, and includes upper conductive structures 222a, 222b (i.e., conductive aluminum pads 222a, 222b) provided at a lower surface thereof. Lower semiconductor element 260 includes semiconductor die 202 bonded to (or otherwise supported by) substrate 204. Lower conductive structures 206a, 206b are provided on an upper surface of lower semiconductor die 202. Substrate 204 in turn is supported by support structure 250. In the configuration shown in FIG. 2A, each of upper conductive structures 222a, 222b are generally aligned with (and configured to be ultraonically bonded to) opposing respective lower conductive structures 206a, 206b. Lower conductive structure 206a includes copper (Cu) pillar 230 provided on an upper surface of lower semiconductor die 202, and an upper aluminum contact structure 216 on an upper surface of Cu pillar 230. Upper aluminum contact structure 216 may be, for example, electroplated or sputtered onto the upper surface of lower copper pillar 230. FIG. 2B is an enlarged view of portion "B" of FIG. 2A and illustrates the top of lower conductive structure 206a at contact with upper conductive element 222a.

Figure 2C:
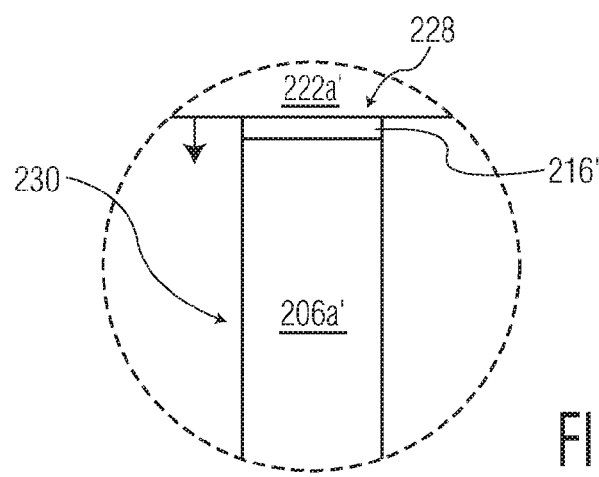
FIG. 2C is a view of FIG. 2B after ultrasonic bonding.

Ultrasonic energy is applied to upper semiconductor element 208 through bonding tool 224 using an ultrasonic transducer (not shown). Ultrasonic energy may cause partial deformation of the conductive structures as illlustrated in FIG. 2C. That is, ultrasonic bond 228 is formed between deformed upper conductive structure 222a' and deformed contact structure 216' (as illustrated in FIG. 2C).

As will be appreciated by those skilled in the art, Cu pillar 230 (including electroplated or sputtered aluminum contact structure/portion 216) is just one example of a conductive structure including aluminum. FIG. 2A also illustrates another exemplary conductive structure 206b. Lower conductive structure 206b is an aluminum structure (or aluminum alloy structure) such as a portion of aluminum wire (that may be bonded using a wire bonding process), an aluminum pillar, etc.

Figure 3:
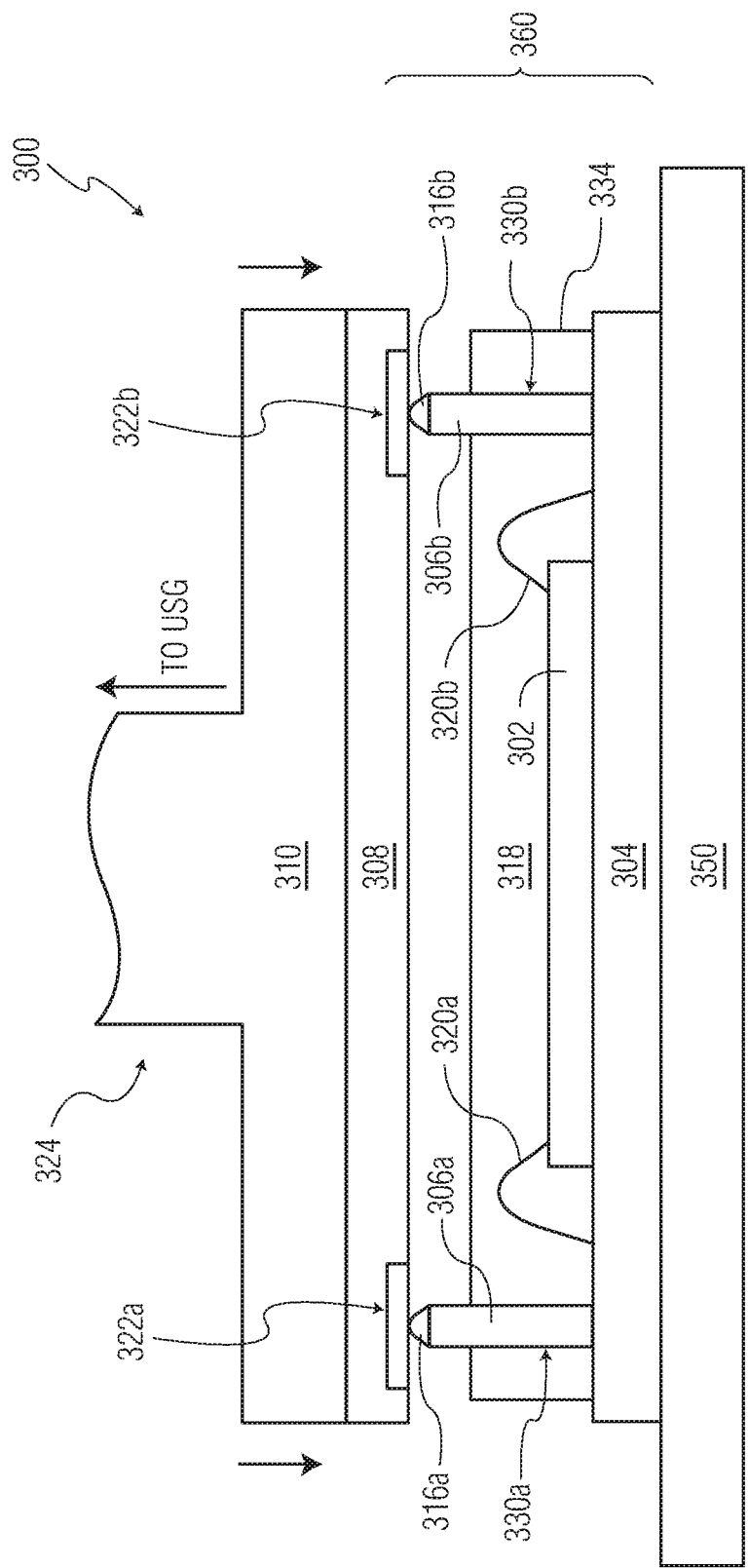
FIG. 3 is a block diagram view of portions of an ultrasonic bonding machine illustrating a structure and method of bonding an upper semiconductor element to a lower semiconductor element in accordance with yet another exemplary embodiment of the invention.

FIG. 3 illustrates portions of ultrasonic bonding machine 300, including bonding tool 324 and support structure 350. Upper semiconductor element 308 is retained (e.g., by vacuum) by holding portion 310 of bonding tool 324, and includes upper conductive structures 322a, 322b (i.e, conductive aluminum pads 322a, 322b). FIG. 3 illustrates the bonding of a packaged semiconductor device 360 (i.e., lower semiconductor element 360) to upper semiconductor element 308. Lower semiconductor element 360 includes semiconductor die 302 bonded to (or otherwise supported by) substrate 304. Lower conductive structures 306a, 306b are provided on an upper surface of substrate 304. Substrate 304 in turn is supported by support structure 350. Wire loops 320a, 320b are bonded between semiconductor die 302 and substrate 304 (while not shown in FIG. 3, die 302 may be flip chip bonded to substrate 304 as opposed to, or in addition to, the wire loop interconnections). A coating/encapsulation 334 (such as a epoxy molding compound) has been applied over die 302 and wire loops 320a, 320b. As illustrated, the upper portions of lower conductive structures 306a, 306b are exposed above coating/encapsulation 334 to permit electrical connection to upper semiconductor element 308.

In the configuration shown in FIG. 3, each of upper conductive structures 322a, 322b are generally aligned with (and configured to be ultrasonically bonded to) opposing respective lower conductive structures 306a, 306b. As illustrated in FIG. 3, each of lower conductive structures 306a, 306b includes a respective Cu pillar 330a, 330b on an upper surface of substrate 304, and a respective upper aluminum contact structure 316a, 316b on an upper surface of Cu pillars 330a, 330b. Upper aluminum contact structures 316a, 316b may be electroplated or sputtered onto the respective upper surfaces of Cu pillars 330a, 330b. As shown, semiconductor element 308 has been moved downward through the motion of bonding tool 324 (as shown by the arrows in FIG. 3) so that FIG. 3 illustrates contact between conductive structures 306a, 322a and 306b, 322b. Ultrasonic energy (with optional heat and/or bond force) is applied to upper semiconductor element 308 (e.g., through bonding tool 324) using an ultrasonic transducer to form ultrasonic bonds between aluminum conductive structures 322a, 322b and respective aluminum contact structures 316a, 316b.

Figure 4A:
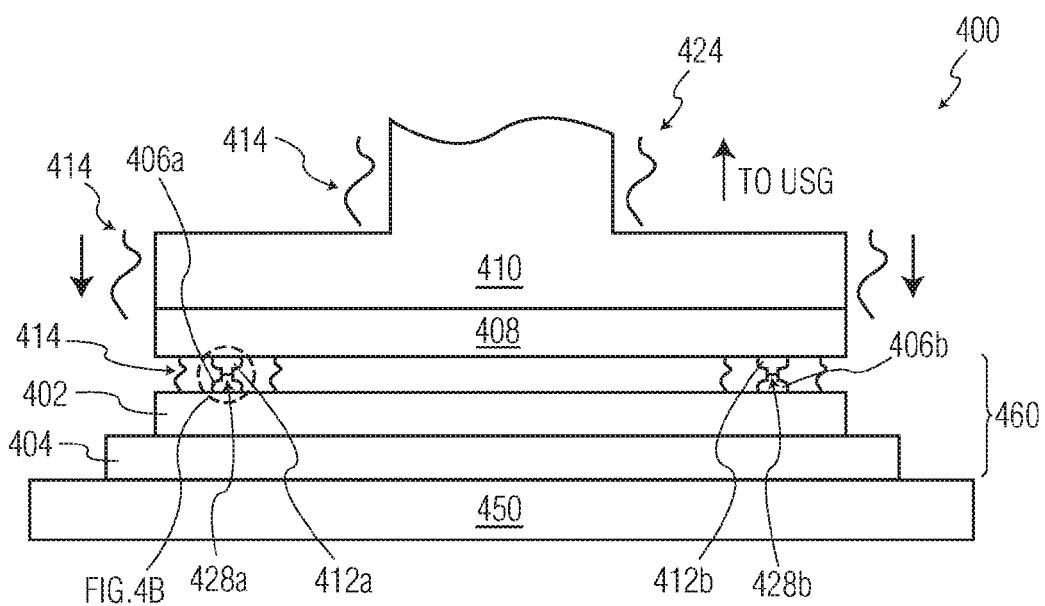
FIG. 4A is a block diagram view of portions of an ultrasonic bonding machine illustrating a structure and method of bonding an upper semiconductor element to a lower semiconductor element in accordance with another exemplary embodiment of the invention.
Figure 4B:
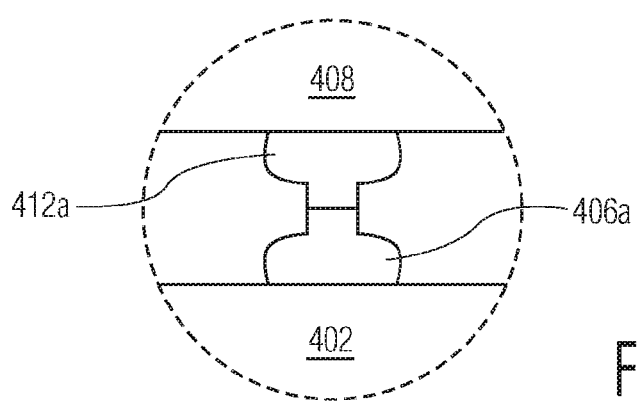
FIG. 4B is an enlarged view of portion "FIG. 4B" of FIG. 4A.
Figure 4C:
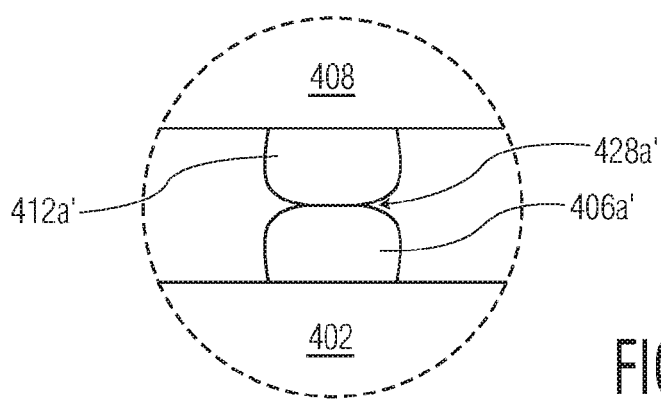
FIG. 4C is a view of FIG. 4B after ultrasonic bonding.

FIG. 4A illustrates portions of ultrasonic bonding machine 400, including bonding tool 424 and support structure 450. Upper semiconductor element 408 is retained (e.g., by vacuum) by holding portion 410 of bonding tool 424, and includes upper conductive structures 412a, 412b (i.e., e.g., sputtered aluminum bumps, aluminum stud bumps, etc.) on a lower surface thereof. Lower semiconductor element 460 includes semiconductor die 402 bonded to (or otherwise supported by) support structure 404 (e.g., an FR4 support structure). Lower conductive structures 406a, 406b (i.e., e.g., sputtered aluminum bumps, aluminum stud bumps, etc.) are provided on an upper surface of lower semiconductor die 402. Substrate 404 in turn is supported by support structure 450. In the configuration shown in FIG. 4A, each of upper conductive structures 412a, 412b are generally aligned with (and configured to be ultrasonically bonded to) opposing respective lower conductive structures 406a, 406b. A detail of structures 412a, 406a (before ultrasonic bonding) is shown in FIG. 4B. Referring again to FIG. 4A, semiconductor element 408 has been moved downward through the motion of bonding tool 424 (as shown by the arrows in FIG. 4A) so that contact is shown between conductive structures 406a, 412a and 406b, 412b. Ultrasonic energy 414 (with optional heat and/or bond force) is applied to upper semiconductor element 408 (e.g., through bonding tool 424) using an ultrasonic transducer to form ultrasonic bonds 428a, 428b between deformed upper aluminum conductive structures and respective deformed lower aluminum contact structures (see, e.g., completed ultrasonic bond 428a' formed between deformed structure 412a' and deformed structure 406a' as illustrated in FIG. 4C).

Figure 5A:
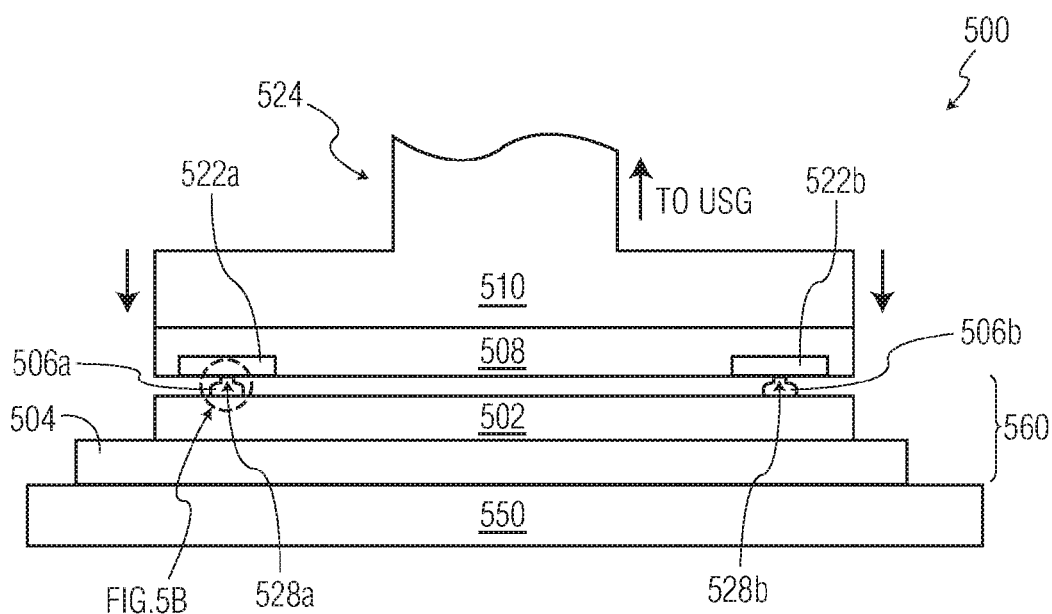
FIG. 5A is a block diagram view of portions of an ultrasonic bonding machine illustrating a structure and method of bonding an upper semiconductor element to a lower semiconductor element in accordance with another exemplary embodiment of the invention.
Figure 5B:
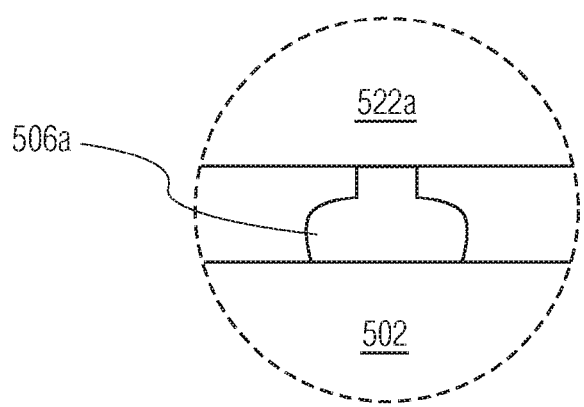
FIG. 5B is an enlarged view of portion "FIG. 5B" of FIG. 5A.
Figure 5C:
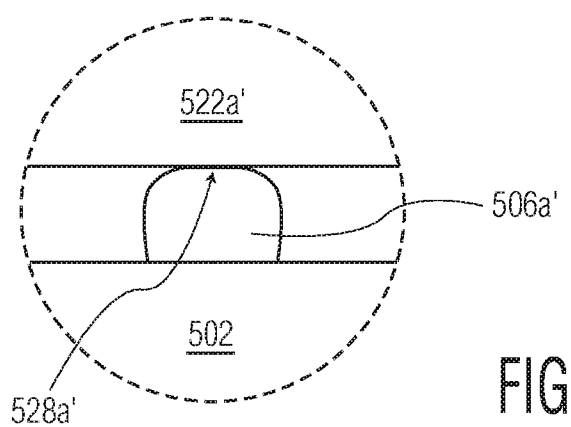
FIG. 5C is a view of FIG. 5B after ultrasonic bonding.

FIG. 5A illustrates portions of ultrasonic bonding machine 500, including bonding tool 524 and support structure 550. Upper semiconductor element 508 retained (e.g., by vacuum) by holding portion 510 of bonding tool 524, and includes upper conductive structures 522a, 522b (i.e, conductive aluminum pads 522a, 522b). Lower semiconductor element 560 includes semiconductor die 502 bonded to (or otherwise supported by) substrate 504 (e.g., an FR4 support structure). Lower conductive structures 506a, 506b (i.e., e.g., sputtered aluminum bumps, aluminum stud bumps, etc.) are provided on an upper surface of lower semiconductor die 502. Substrate 504 in turn is supported by support structure 550. In the configuration shown in FIG. 5A, each of upper conductive structures 522a, 522b are generally aligned with (and configured to be ultrasonically bonded to) opposing respective lower conductive structures 506a, 506b. A detail of structures 522a, 506a (before ultrasonic bonding) is shown in FIG. 5B. As shown, semiconductor element 508 has been moved downward through the motion of bonding tool 524 (as shown by the arrows in FIG. 5A) so that FIG. 5A illustrates contact between conductive structures 506a, 522a. Ultrasonic energy (with optional heat and/or bond force) is applied to upper semiconductor element 508 (e.g., through bonding tool 424) using an ultrasonic transducer to form ultrasonic bonds 528a, 528b between deformed upper aluminum conductive structures and respective deformed lower aluminum contact structures (see, e.g., completed ultrasonic bond 528a' formed between deformed structure 522a' and deformed structure 506a' as illustrated in FIG. 5C).

Figure 6A:
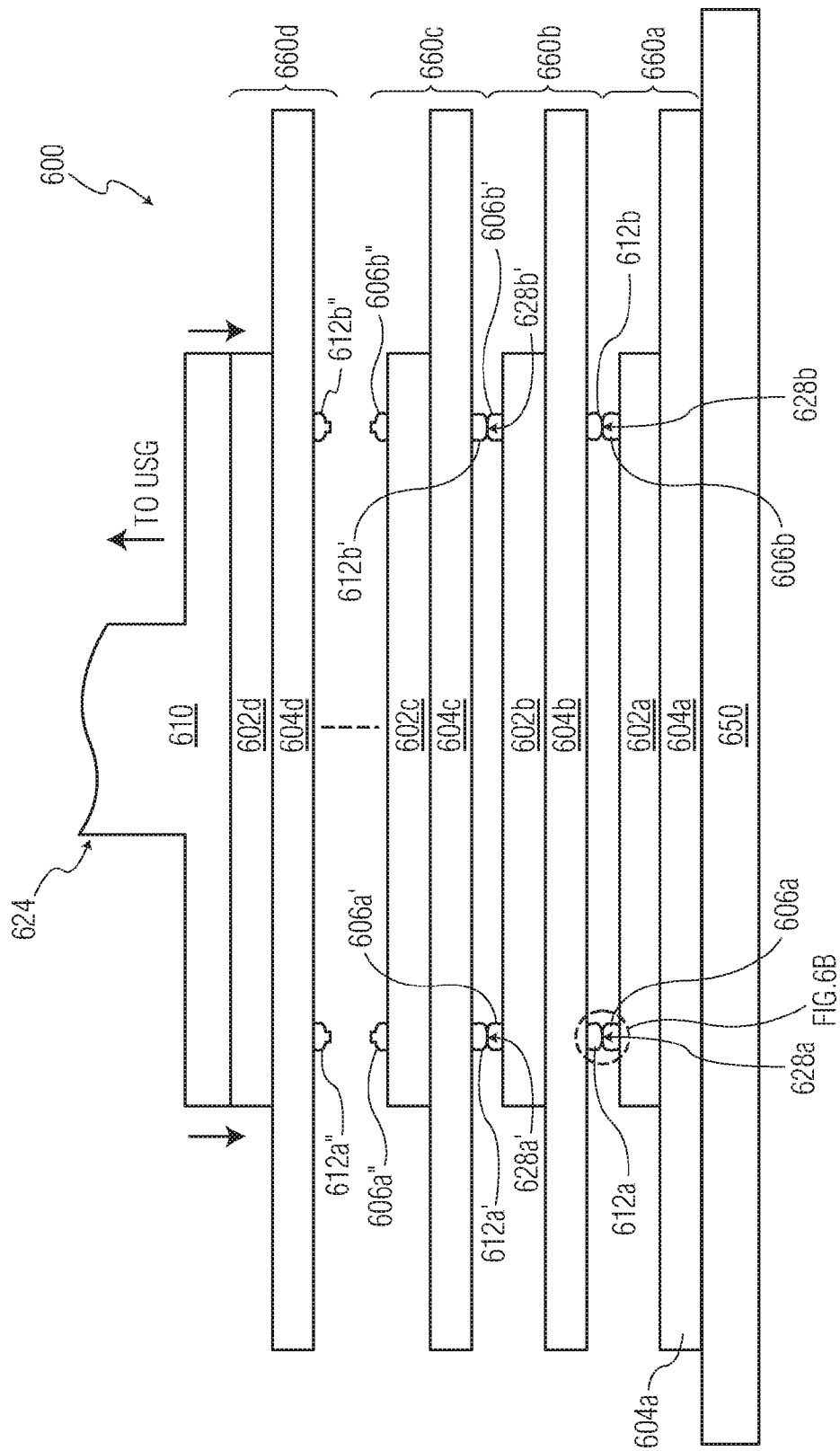
FIG. 6A is a block diagram view of portions of an ultrasonic bonding machine illustrating a structure and method of bonding an upper semiconductor element to a lower semiconductor element in accordance with yet another exemplary embodiment of the invention.

FIG. 6A illustrates the ultrasonic bonding machine 600, including bonding tool 624 and support structure 650. In FIG. 6, a plurality of semiconductor elements have been bonded together in a stacked configuration, in accordance with the teachings of the present invention. Specifically, semiconductor element 660a includes semiconductor die 602a bonded to (or otherwise supported by) substrate 604a, where conductive structures 606a, 606b (i.e., e.g., sputtered aluminum bumps, aluminum stud bumps, etc.) are provided on an upper surface of semiconductor die 602a. Semiconductor element 660a is supported by support structure 650.

Figure 6B:
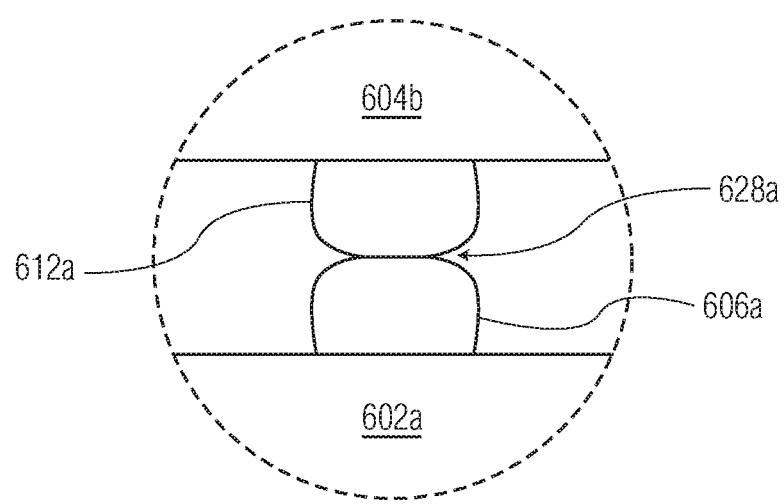
FIG. 6B is an enlarged view of portion of "FIG. 6B" of FIG. 6A.
Figure 6C:
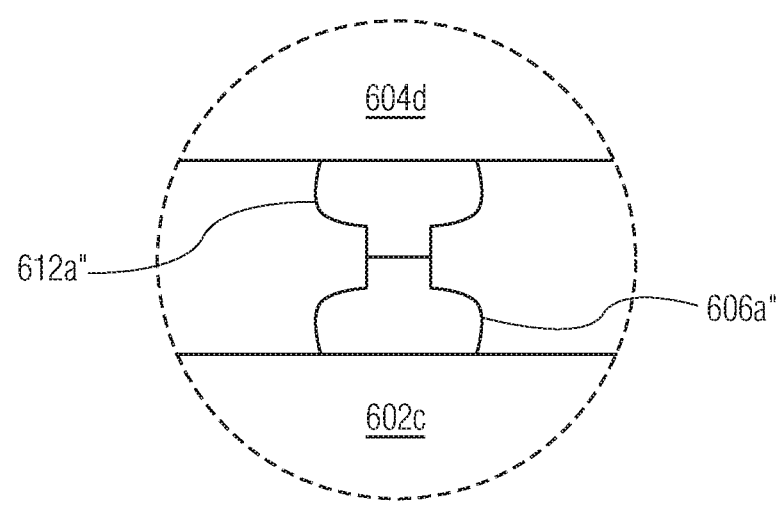
FIG. 6C is a view of a portion of FIG. 6A after contact between conductive structures.

Another semiconductor element 660b (including a corresponding semiconductor die 602b bonded to, or otherwise supported by, substrate 604b—and including conductive structures 612a, 612b on substrate 604b) has been previously been bonded to semiconductor element 660a. More specifically, bonding tool 624 previously bonded (e.g., ultrasonically bonded) element 660b to element 660a such that ultrasonic bonds 628a, 628b were formed between respective pairs of aluminum conductive structures 612a, 606a and 612b, 606b. Element 660b also includes conductive structures 606a', 606b' which have been bonded to conductive structures of element 660c in a step described below. FIG. 6B illustrates a detailed view of ultrasonic bond 628a including deformed conductive structures 612a, 606a.

Likewise, another semiconductor element 660c (including a corresponding semiconductor die 602c bonded to, or otherwise supported by, substrate 604c—and including conductive structures 612a', 612b' on substrate 604c) has been previously been bonded to semiconductor element 660b. More specifically, bonding tool 624 previously bonded (e.g., ultrasonically bonded) element 660c to element 660b such that ultrasonic bonds 628a', 628b' were formed between respective pairs of aluminum conductive structures 612a', 606a' and 612b', 606b'. Element 660c also includes conductive structures 606a", 606b" which will be bonded to conductive structures of element 660d in a step described below.

As shown in FIG. 6A, upper semiconductor element 660d is retained (e.g., by vacuum) by holding portion 610 of bonding tool 624, and includes semiconductor die 602d bonded to (or otherwise supported by) substrate 604d. Conductive structures 612a", 612b" (i.e., e.g., sputtered aluminum bumps, aluminum stud bumps, etc.) are provided on a lower surface of substrate 604d. Conductive structures 612a", 612b" are generally aligned with (and configured to be ultrasonically bonded to) opposing respective conductive structures 606a", 606b". Semiconductor element 660d is moved downward through the motion of bonding tool 624 (as shown by the arrows in FIG. 6A). Following this downward motion, contact will occur between respective pairs of conductive structures 612a", 606a" and 612b", 606b" (see, e.g., the FIG. 6C detailed view of contact between conductive structures 612a", 606a" prior to deformation through ultrasonic bonding). Ultrasonic energy is applied to upper semiconductor element 604d through bonding tool 624 using an ultrasonic transducer (not shown) to form the ultrasonic bonds between respective pairs of conductive structures 612a", 606a" and 612b", 606b".

While specific exemplary upper and lower aluminum conductive structures have been illustrated, one skilled in the art would understand that a variety of shapes and designs of upper and lower aluminum conductive structures are permissible within the teachings of the present invention.

Figure 7:
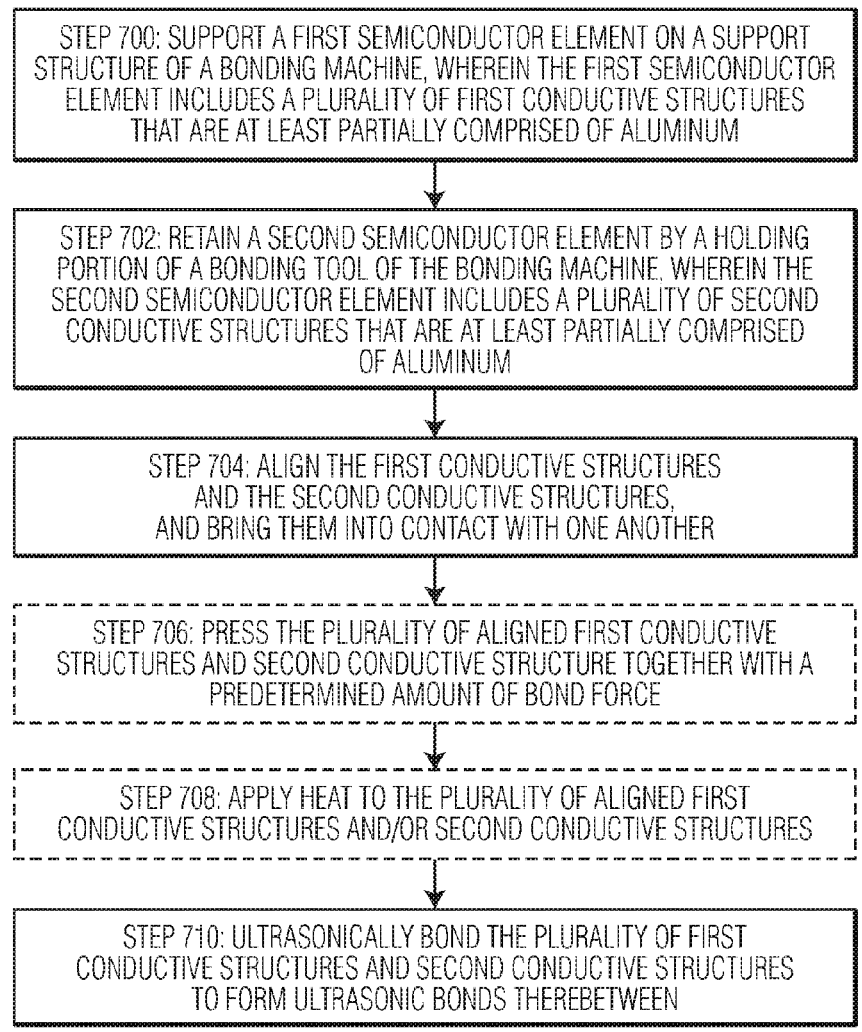
FIG. 7 is a flow diagram illustrating a method of ultrasonically bonding semiconductor elements in accordance with an exemplary embodiment of the invention.

FIG. 7 is a flow diagram illustrating a method of bonding semiconductor elements together in accordance with an exemplary embodiment of the present invention. As is understood by those skilled in the art, certain steps included in the flow diagram may be omitted; certain additional steps may be added; and the order of the steps may be altered from the order illustrated. At Step 700, a first semiconductor element (e.g., including a semiconductor die on a substrate) is supported on a support structure of a bonding machine. The first semiconductor element (e.g., an upper surface of the semiconductor structure) includes a plurality of first conductive structures that are at least partially comprised of aluminum (see, e.g., structures 106a, 106b of element 160 in FIG. 1A; structures 206a, 206b of element 260 in FIG. 2A; structures 306a, 306b of element 360 in FIG. 3A; structures 406a, 406b of element 460 in FIG. 4A; structures 506a, 506b of element 560 in FIG. 5A; and structures 606a″, 606b″ of element 660c in FIG. 6A). At Step 702, a second semiconductor element is retained by a holding portion of a bonding tool of the bonding machine (see, e.g., elements 108, 208, 308, 408, 508, and 660d in the corresponding figures). The second semiconductor element includes a plurality of second conductive structures (e.g., on a lower surface of the second semiconductor element) that are at least partially comprised of aluminum. At Step 704, the first conductive structures and the second conductive structures are aligned with one another (see, e.g., FIGS. 1A and 6A) and are then brought into contact with one another. At optional Step 706, the plurality of aligned first conductive structures and second conductive structure are pressed together with a predetermined amount of bond force. The predetermined amount of bond force may be a single bond force value, or may be a bond force profile where the actual bond force is varied during the bonding operation. At optional Step 708, heat is applied to the plurality of aligned first conductive structures and/or second conductive structures. For example, heat may be applied to the first conductive structures using the support structure that supports the first semiconductor element. Likewise, heat may be applied to the second conductive structures using the bonding tool that retains the second semiconductor element At Step 710, the plurality of first conductive structures and second conductive structures are ultrasonically bonded together to form ultrasonic bonds therebetween.

As will be appreciated by those skilled in the art, the present invention has particular benefits when an ambient/lower temperature bonding operation is desired as the present invention bonds aluminum materials to aluminum materials which may be readily accomplished with ultrasonic energy and/or bond force, often without the need for heat.

Although the present invention has been illustrated and described primarily with respect to two pairs of conductive structures ultrasonically bonded together, it is of course not limited thereto. In practice, semiconductor packages (e.g., advanced packages) assembled in accordance with the present invention may have any number of conductive structures, and may have hundreds of pairs (or even thousands) of conductive structures ultrasonically bonded together. Further, the conductive structures need not be bonded in pairs. For example, one structure may be bonded to two or more opposing structures. Thus, any number of conductive structures from one semiconductor element may be ultrasonically bonded to any number of conductive structures of another semiconductor element.

Although the present invention primarily describes (and illustrates) the application of ultrasonic energy through a bonding tool (e.g., where the bonding tool is engaged with an ultrasonic transducer), it is not limited thereto. Rather, the ultrasonic energy may be transmitted through any desired structure, such as for example the support structure.

As will be appreciated by those skilled in the art, the details of the ultrasonic bonding may vary widely depending on the specific application. Nonetheless, some non-limiting exemplary details are now described. For example, the frequency of the ultrasonic transducer may be designed in connection with the design of the conductive structures (e.g., pillar structures, etc.), such that a transducer resonant frequency substantially coincides with a resonant frequency of the given semiconductor element—in this regard, the conductive structures may act dynamically as a cantilever beam. In another exemplary alternative, the transducer may be operated at an off-resonant condition relative to the semiconductor element in a simple "driven" type fashion.

Exemplary ranges for the energy applied to the ultrasonic transducer (e.g., applied to piezoelectric crystals/ceramics in the transducer driver) may be in the range of 0.1 kHz-160 kHz, 10 kHz-120 kHz, 20 kHz-60 kHz, etc. A single frequency may be applied, or a plurality of frequencies may be applied during bonding (e.g., sequentially, simultaneously, or both). The scrub of the semiconductor element (i.e., vibrational energy applied to the semiconductor element held by the bonding tool) may be applied in any of a number of desired directions, and may be applied: through a bonding tool holding a semiconductor element (as illustrated herein); through a support structure supporting a semiconductor element; amongst other configurations. Referring specifically to the embodiments illustrated herein (where the ultrasonic energy is applied through a bonding tool holding a semiconductor element), the scrub may be applied in a direction substantially parallel to, or substantially perpendicular to, a longitudinal axis of the bond tool (or in other directions).

The vibrational energy applied by the ultrasonic transducer may be applied, for example, in the peak-to-peak amplitude range of 0.1 um to 10 um (e.g., with feedback control of constant voltage, constant current, or alternate control schemes including but not limited to ramped current, ramped voltage, or proportional feedback control based on one or more inputs).

As described herein, bond force may also be applied during at least a portion of the ultrasonic bonding cycle. An exemplary range for the bond force is 0.1 kg to 100 kg. The bond force may be applied as a constant value, or may be a bond force profile that changes during the bonding cycle. In a controlled bond force implementation, the feedback control of the bond force may be constant, ramped or proportional based on one or more inputs (e.g., ultrasonic amplitude, time, velocity, deformation, temperature, etc).

As described herein, one or more of the semiconductor elements may be heated prior to and/or during the bond cycle. An exemplary range of the temperature of a semiconductor element is between 20° C.-250° C. The heat (e.g., applied through one or both of the bond tool and the support structure, or other elements) may be applied as a constant value, or may be a temperature profile that changes during the bonding cycle—and may be controlled using feedback control.

Although the present invention has been illustrated and described primarily with respect to forming ultrasonic bonds between aluminum conductive structures on respective semiconductor elements, it is of course not limited thereto. That is, the teachings of the present invention may have applicability in forming ultrasonic bonds between conductive structures having varying compositions. An exemplary list of materials for the conductive structures being joined includes: aluminum to copper (i.e., forming ultrasonic bonds between aluminum conductive structures on one semiconductor element to copper conductive structures on another semiconductor element); lead free solder (e.g., primarily composed of tin) to copper; lead free solder to aluminum; copper to copper; aluminum to silver; copper to silver; aluminum to gold; gold to gold; and copper to gold. Of course, other combinations of conductive structure compositions (e.g., indium) are contemplated.

As provided above, while aspects of the invention have been described in connection with an aluminum material included in the various conductive structures of the semiconductor elements, the invention is not limited thereto. That is, the conductive structures on the semiconductor elements may include (or be formed of) various different materials. For example, the conductive structures on the upper semiconductor element (e.g., the element being carried, and bonded, using a bonding tool), and/or the conductive structures on the lower semiconductor element (e.g., the element to which the upper conductive element is bonded), may be formed of (or include) copper. The surface of such a copper material may be subject to atmospheric contamination; that is, the copper surface tends to oxidize.

Thus, in certain embodiments of the invention, at least one of the plurality of first conductive structures and the plurality of second conductive structures may be formed of (or include) copper. In such embodiments of the invention, the entire conductive structures need not be formed of copper—rather, the plurality of first conductive structures and/or the plurality of second conductive structures may include copper at an interface portion adjacent the other of the plurality of first conductive structures and the plurality of second conductive structures.

In accordance with aspects of the invention, a coating (e.g., an inorganic coating) may be applied to the surface of such conductive structures to prevent oxidation of the copper surface (e.g., the connection surface of copper conductive structures, such as copper pillars) prior to ultrasonic bonding. Specifically, such a coating may be applied to a surface (e.g., a joining surface) of the conductive structures on the upper semiconductor element (e.g., the element being carried, and bonded, using a bonding tool), and/or the conductive structures on the lower semiconductor element (e.g., the element to which the upper conductive element is bonded) prior to bonding.

Such a coating may be, for example, an inorganic coating (e.g., a silicon oxynitride coating) applied as a thin frangible coating on the conductive structures (e.g., copper pillar conductive structures). Prior to the formation of flip chip interconnections between respective conductive structures on an upper semiconductor element and a lower semiconductor element, the coating may act to protect certain of the conductive structures (such as copper conductive structures) from oxidation, etc. Then, in connection with an ultrasonic flip chip joining process, the coating(s) on the respective conductive structures is ultrasonically scrubbed away, thereby establishing a metal to metal contact/interconnection.

By providing the coating on the conductive structures, the productivity and robustness of fine pitch flip chip packaging may be improved. For example, as flip chip packaging (which may include copper interconnections) moves to finer and finer pitch, use of the coating has applicability in the creation of interconnects in various applications including but not limited to, die to substrate, die to die, and die to wafer.

After breaking through of the coating (and/or other oxide layers formed on the conductive structures) using ultrasonic energy, the final joining process between the conductive structures of the semiconductor elements (e.g., which may include any desired combination of heat, pressure and/or force) is completed.

Figure 8A:
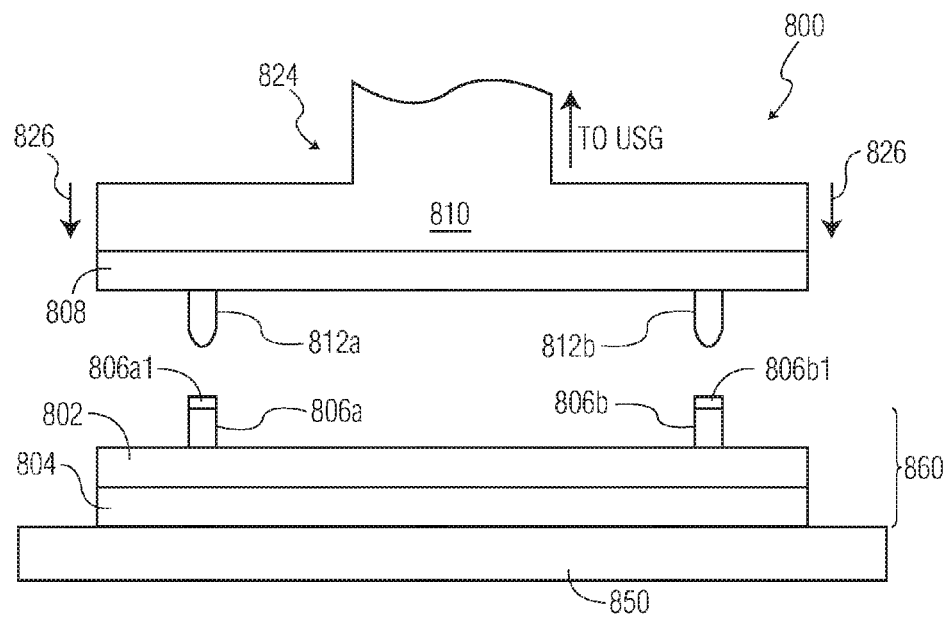
FIGS. 8A-8C are block diagram views of portions of an ultrasonic bonding machine illustrating a structure and method of bonding an upper semiconductor element to a lower semiconductor element in accordance with an exemplary embodiment of the invention.
Figure 8B:
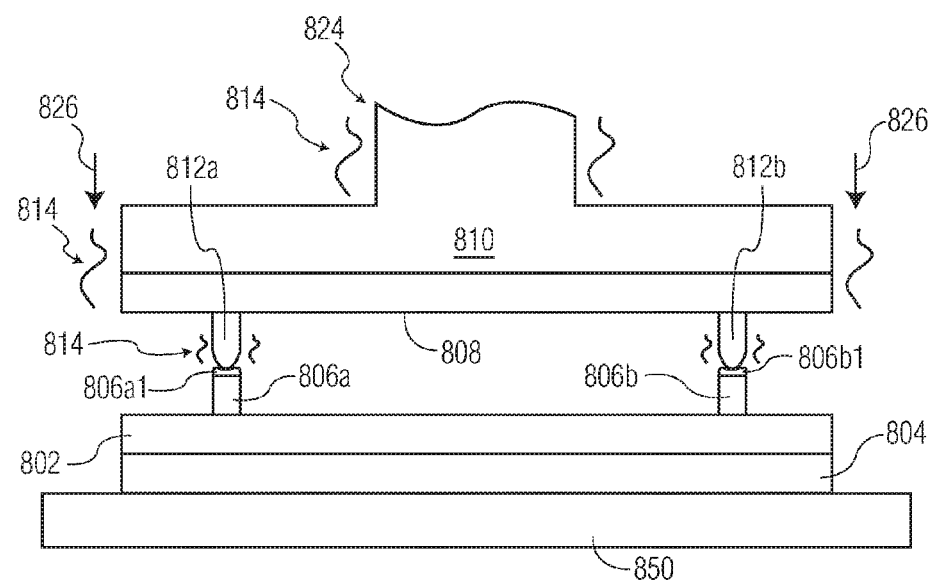
Figure 8C:
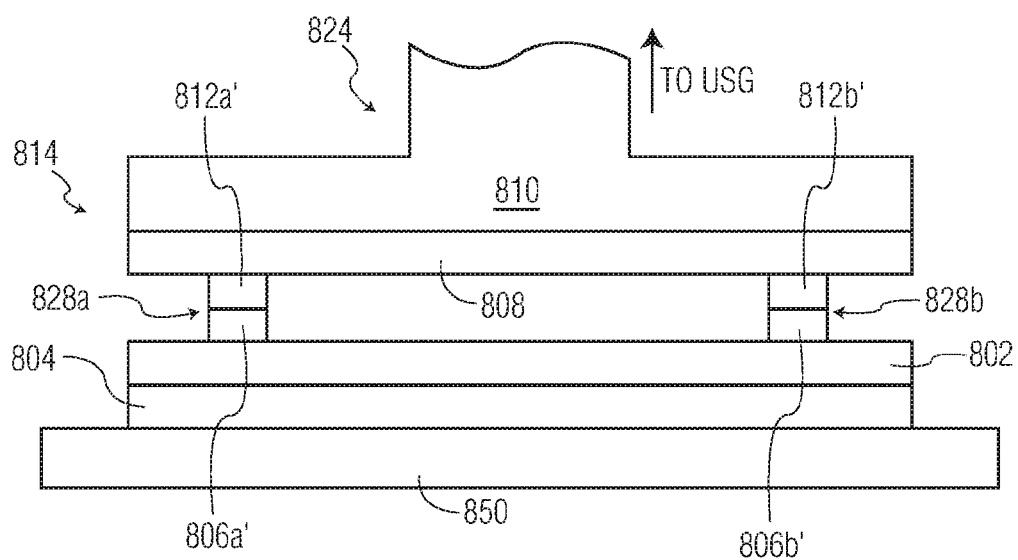
Figure 9:
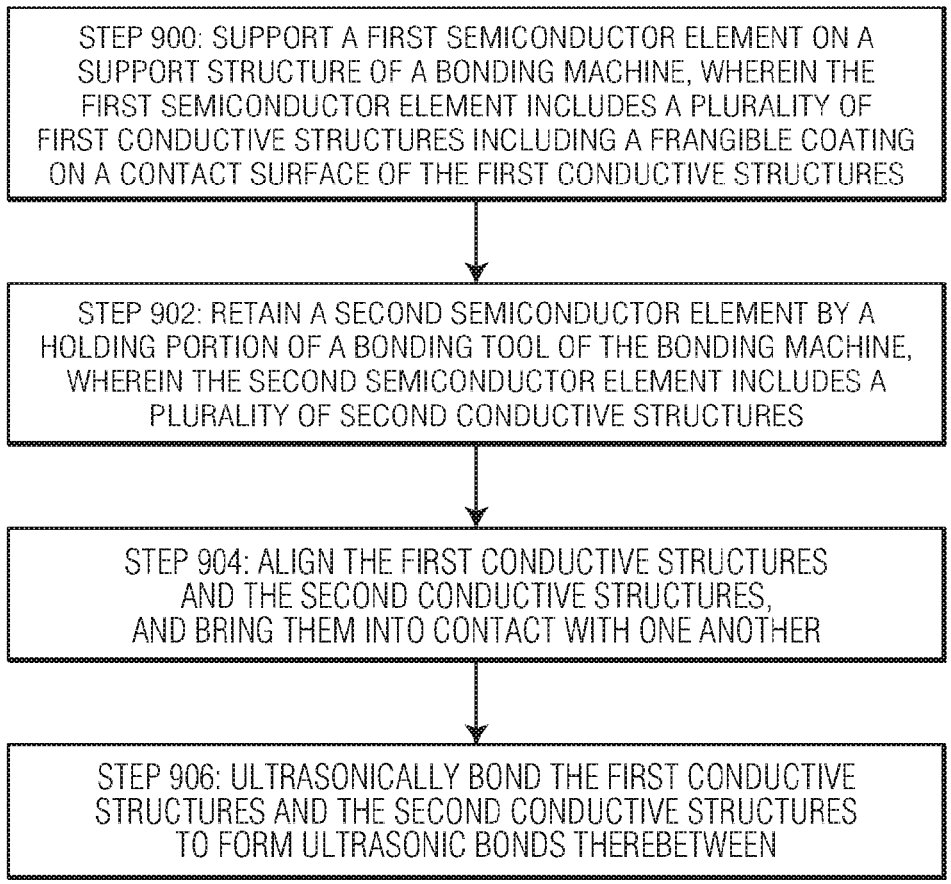
FIG. 9 is a flow diagram illustrating a method of ultrasonically bonding semiconductor elements in accordance with an exemplary embodiment of the invention.

FIGS. 8A-8C (along with the flow diagram of FIG. 9), FIGS. 10A-10C (along with the flow diagram of FIG. 11), and FIGS. 12A-12C (along with the flow diagram of FIG. 13) illustrate systems and methods of forming interconnections between semiconductor elements utilizing the aforementioned coating(s). FIGS. 9, 11, and 13 are flow diagrams illustrating methods of bonding semiconductor elements together in accordance with an exemplary embodiment of the present invention. As is understood by those skilled in the art, certain steps included in the flow diagrams may be omitted; certain additional steps may be added; and the order of the steps may be altered from the order illustrated.

Referring specifically to FIG. 8A, upper semiconductor element 808 is retained (e.g., by vacuum, such as through vacuum ports defined by the holding surface of holding portion 810) by holding portion 810 of bonding tool 824. Upper semiconductor element 808 includes upper conductive structures 812*a*, 812*b* on a lower surface thereof. Lower semiconductor element 860 includes semiconductor die 802 bonded to (or otherwise supported by) substrate 804. Lower conductive structures 806*a*, 806*b* (e.g., copper conductive structures such as copper pillars, other conductive structures) are provided on an upper surface of lower semiconductor die 802. Coating 806*a*1 is provided on conductive structure 806*a*, and coating 806*b*1 is provided in conductive structure 806*b*. Substrate 804 in turn is supported by support structure 850 (e.g., a heat block of machine 800, an anvil of machine 800, or any other desired support structure). In the configuration shown in FIG. 8A (preparing for bonding), each of upper conductive structures 812*a*, 812*b* are generally aligned with opposing respective lower conductive structures 806*a*, 806*b*. Semiconductor element 808 is moved downward through the motion of bonding tool 824 (as shown by the arrows 826 in FIG. 8A). Following this motion, FIG. 8B illustrates contact between the respective conductive structures 806*a* (including coating 806*a*1), 812*a* and 806*b* (including coating 806*b*1), 812*b*. Ultrasonic energy 814 is applied to upper semiconductor element 808 and upper conductive structures 812*a*, 812*b* through bonding tool 824 using an ultrasonic transducer (not shown but indicated in the drawings as "USG", that is, ulrasonic generator). For example, an ultrasonic transducer that carries bonding tool 824 may in turn be carried by a bond head assembly of flip chip bonding machine 800. During the ultrasonic bonding, lower conductive structures 806*a*, 806*b* may be held relatively stationary through the support of lower semiconductor element 860 by support structure 850 (e.g., a support surface of support structure 850 may include one or more vacuum ports to secure substrate 804 to support structure 850 during bonding). Ultrasonic energy 814 (along with optional bond force and/or heat) may cause partial deformation of the conductive structures. For example, conductive structures 806*a*, 806*b* and 812*a*, 812*b* are illustrated as being deformed (or at least partially deformed) in FIG. 8C. Ultrasonic bonds are formed between respective pairs of conductive structures in FIG. 8C. For example, ultrasonic bond 828*a* is formed between deformed conductive structures 812*a*'/806*a*', and ultrasonic bond 828*b* is formed between deformed conductive structures 812*b*'/806*b*'.

Referring specifically to FIG. 9, at Step 900, a first semiconductor element (e.g., including a semiconductor die on a substrate, such as element 860 shown in FIG. 8A) is supported on a support structure of a bonding machine. The first semiconductor element (e.g., an upper surface of the semiconductor structure) includes a plurality of first conductive structures including a frangible coating on a contact surface (e.g., the bonding surface for flip chip bonding) of the conductive structures (see, e.g., structures 806*a*, 806*b* of element 860, including coatings 806*a*1, 806*b*1, as shown in FIG. 8A). At Step 902, a second semiconductor element is retained by a holding portion of a bonding tool of the bonding machine (see, e.g., element 808 in FIG. 8A). The second semiconductor element includes a plurality of second conductive structures (e.g., on a lower surface of the second semiconductor element). At Step 904, the first conductive structures and the second conductive structures are aligned with one another (see, e.g., FIG. 8A) and are then brought into contact with one another (see, e.g., FIG. 8B). At Step 906, ultrasonic energy is applied to the second semiconductor element (through a bonding tool carrying the second semiconductor element, such as in FIG. 8B), such that the conductive structures of the second semiconductor element break through respective coatings of the conductive structures of the first semiconductor element in connection with the formation of ultrasonic bonds between the pairs of conductive structures (e.g., see ultrasonic bonds 828*a*, 828*b* in FIG. 8C).

Figure 10A:
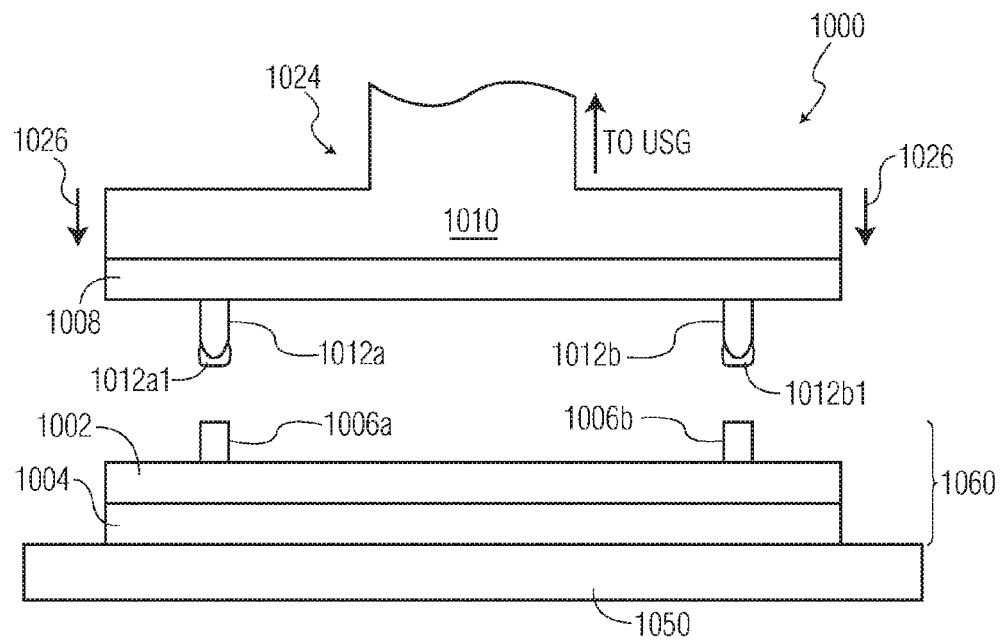
FIGS. 10A-10C are block diagram views of portions of an ultrasonic bonding machine illustrating another structure and method of bonding an upper semiconductor element to a lower semiconductor element in accordance with another exemplary embodiment of the invention.
Figure 10B:
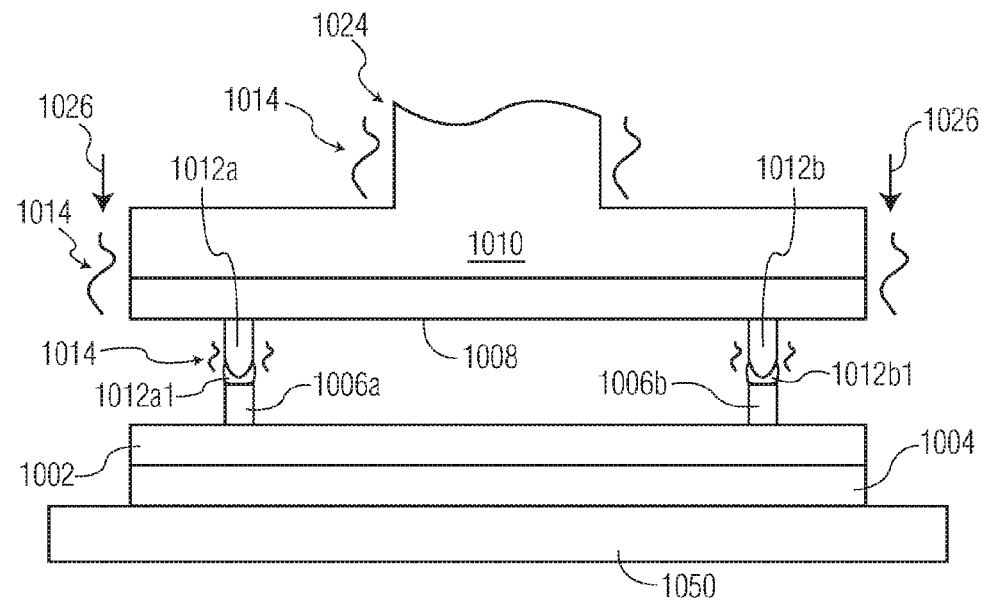
Figure 10C:
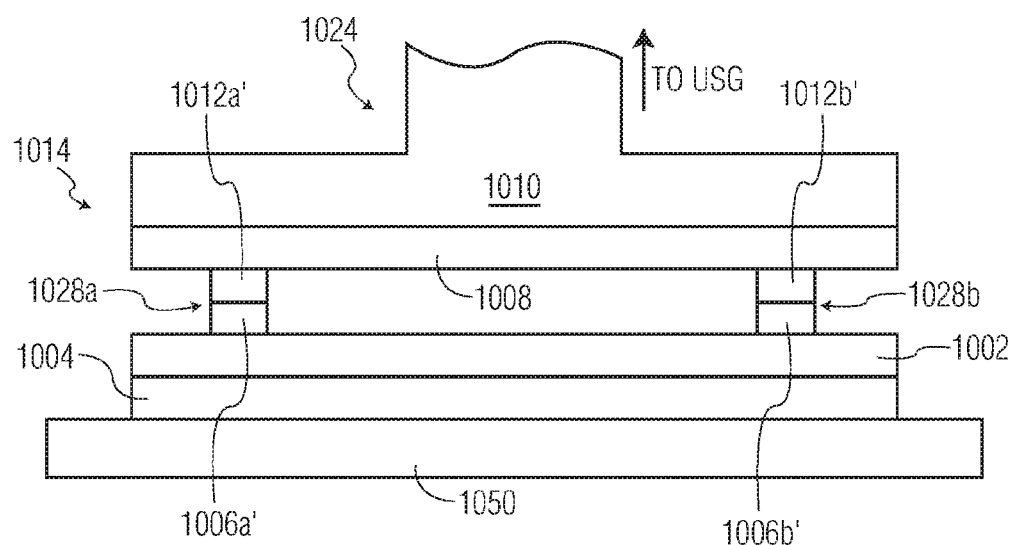
Figure 11:
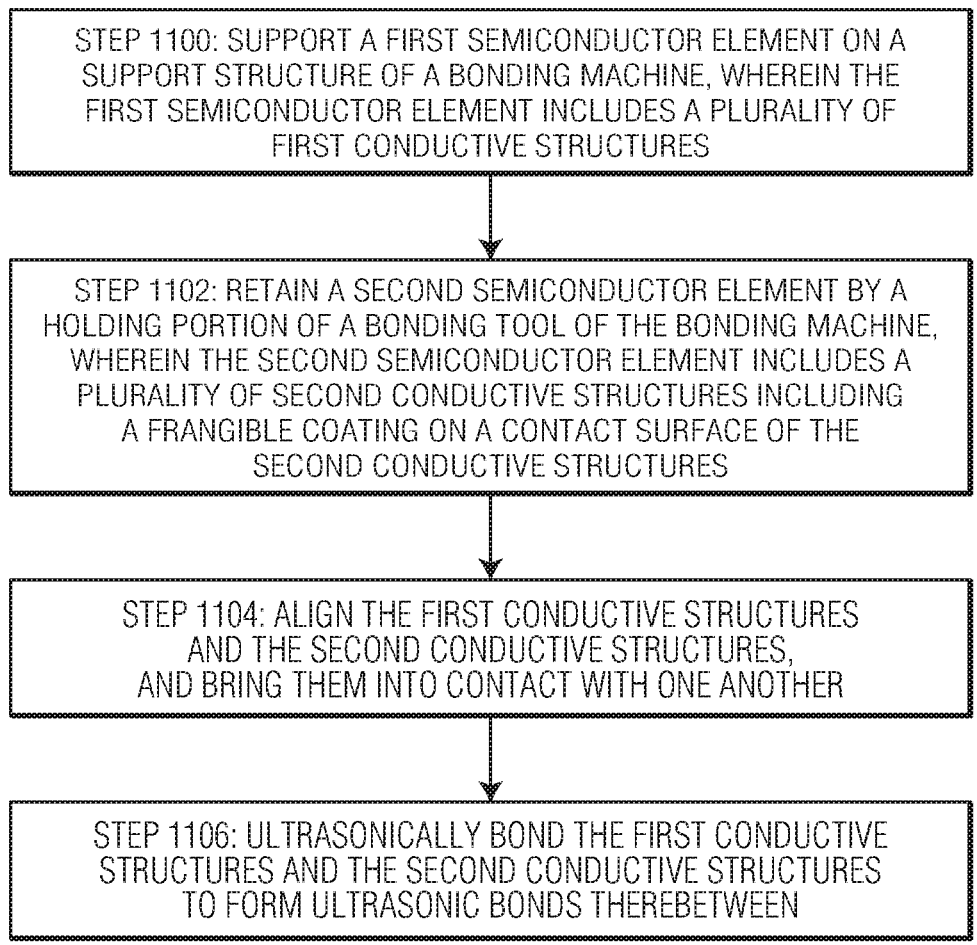
FIG. 11 is a flow diagram illustrating yet another method of ultrasonically bonding semiconductor elements in accordance with yet another exemplary embodiment of the invention.

Referring specifically to FIG. 10A, upper semiconductor element 1008 is retained (e.g., by vacuum, such as through vacuum ports defined by the holding surface of holding portion 1010) by holding portion 1010 of bonding tool 1024. Upper semiconductor element 1008 includes upper conductive structures 1012*a*, 1012*b* (e.g. conductive structures formed of, or including, copper) on a lower surface thereof, where coating 1012*a*1 is provided on conductive structure 1012*a*, and coating 1012*b*1 is provided in conductive structure 1012*b*. Lower semiconductor element 1060 includes semiconductor die 1002 bonded to (or otherwise supported by) substrate 1004. Lower conductive structures 1006*a*, 1006*b* (e.g., copper conductive structures such as copper pillars, other conductive structures) are provided on an upper surface of lower semiconductor die 1002. Substrate 1004 in turn is supported by support structure 1050 (e.g., a heat block of machine 1000, an anvil of machine 1000, or any other desired support structure). In the configuration shown in FIG. 10A (preparing for bonding), each of upper conductive structures 1012*a*, 1012*b* are generally aligned with opposing respective lower conductive structures 1006*a*, 1006*b*. Semiconductor element 1008 is moved downward through the motion of bonding tool 1024 (as shown by the arrows 1026 in FIG. 10A). Following this motion, FIG. 10B illustrates contact between the respective conductive structures 1006*a*, 1012*a* (including coating 1012*a*1) and 1006*b*, 1012*b* (including coating 1012*b*1). Ultrasonic energy 1014 is applied to upper semiconductor element 1008 and upper conductive structures 1012*a*, 1012*b* through bonding tool 1024 using an ultrasonic transducer. For example, an ultrasonic transducer that carries bonding tool 1024 may in turn be carried by a bond head assembly of machine 1000. During the ultrasonic bonding, lower conductive structures 1006*a*, 1006*b* may be held relatively stationary through the support of lower semiconductor element 1060 by support structure 1050 (e.g., a support surface of support structure 1050 may include one or more vacuum ports to secure substrate 1004 to support structure 1050 during bonding). Ultrasonic energy 1014 (along with optional bond force and/or heat) may cause partial deformation of the conductive structures. For example, conductive structures 1006*a*, 1006*b* and 1012*a*, 1012*b* are illustrated as being deformed (or at least partially deformed) in FIG. 10C. Ultrasonic bonds are formed between respective pairs of conductive structures in FIG. 10C. For example, ultrasonic bond 1028*a* is formed between deformed conductive structures 1012*a*'/1006*a*', and ultrasonic bond 1028*b* is formed between deformed conductive structures 1012*b*'/1006*b*'.

Referring specifically to FIG. 11, at Step 1100, a first semiconductor element (e.g., including a semiconductor die on a substrate, such as element 1060 shown in FIG. 10A) is supported on a support structure of a bonding machine. The first semiconductor element (e.g., an upper surface of the semiconductor structure) includes a plurality of first conductive structures (see, e.g., structures 1006*a*, 1006*b* of element 1060, as shown in FIG. 10A). At Step 1102, a second semiconductor element is retained by a holding portion of a bonding tool of the bonding machine (see, e.g., element 1008 in FIG. 10A). The second semiconductor element includes a plurality of second conductive structures (e.g., on a lower surface of the second semiconductor element), including a coating on a contact portion of the conductive structures (see, e.g., structures 1012*a*, 1012*b* of element 1060, including coatings 1012*a*1, 1012*b*1, as shown in FIG. 10A). At Step 1004, the first conductive structures and the second conductive structures are aligned with one another (see, e.g., FIG. 10A) and are then brought into contact with one another. At Step 1006, ultrasonic energy is applied to the second semiconductor element (through a bonding tool carrying the second semiconductor element, such as in FIG. 10B), such that the conductive structures of the first semiconductor element break through respective coatings of the conductive structures of the second semiconductor element in connection with the formation of ultrasonic bonds between the pairs of conductive structures (e.g., see ultrasonic bonds 1028*a*, 1028*b* in FIG. 10C).

Figure 12A:
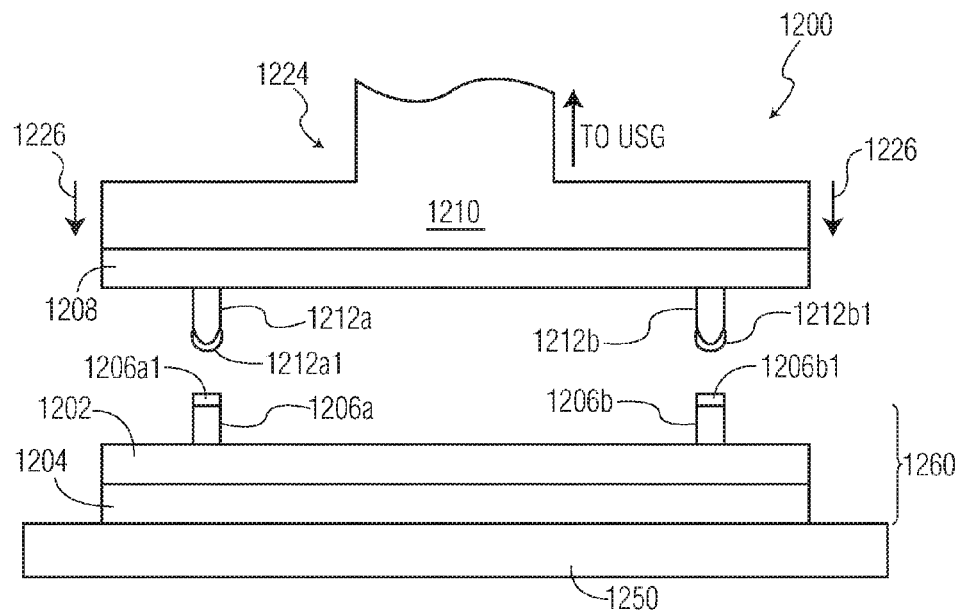
FIGS. 12A-12C are block diagram views of portions of an ultrasonic bonding machine illustrating yet another structure and method of bonding an upper semiconductor element to a lower semiconductor element in accordance with yet another exemplary embodiment of the invention.
Figure 12B:
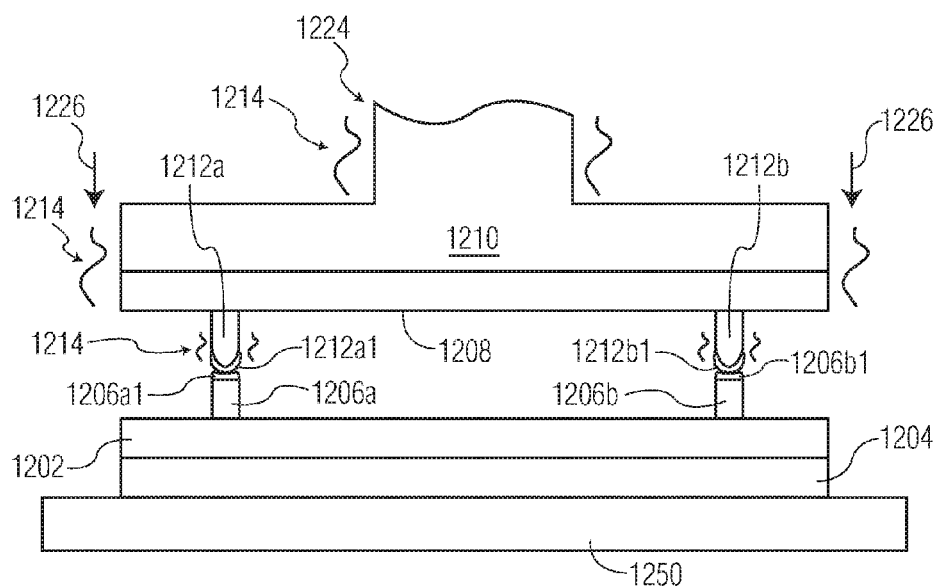
Figure 12C:
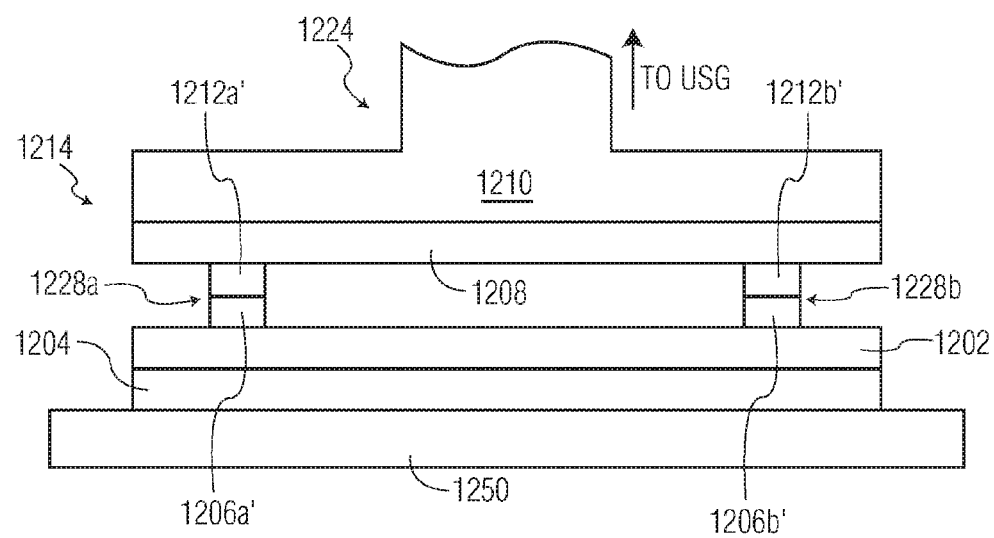
Figure 13:
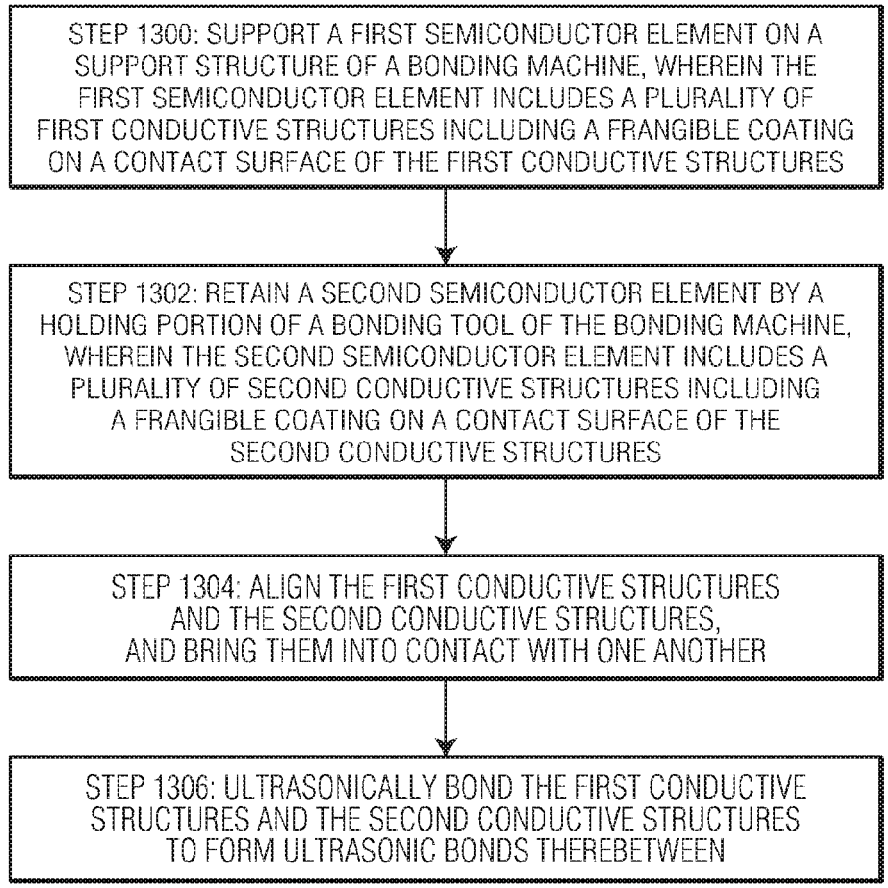
FIG. 13 is a flow diagram illustrating yet another method of ultrasonically bonding semiconductor elements in accordance with yet another exemplary embodiment of the invention.

Referring specifically to FIG. 12A, upper semiconductor element 1208 is retained (e.g., by vacuum, such as through vacuum ports defined by the holding surface of holding portion 1210) by holding portion 1210 of bonding tool 1224. Upper semiconductor element 1208 includes upper conductive structures 1212*a*, 1212*b* (e.g., conductive structures formed of copper, or including copper) on a lower surface thereof, where coating 1212*a*1 is provided on conductive structure 1212*a*, and coating 1212*b*1 is provided on conductive structure 1212*b*. Lower semiconductor element 1260 includes semiconductor die 1202 bonded to (or otherwise supported by) substrate 1204. Lower conductive structures 1206*a*, 1206*b* (e.g., copper conductive structures such as copper pillars, other conductive structures) are provided on an upper surface of lower semiconductor die 1202. Coating 1206*a*1 is provided on conductive structure 1206*a*, and coating 1206*b*1 is provided in conductive structure 1206*b*. Substrate 1204 in turn is supported by support structure 1250 (e.g., a heat block of machine 1200, an anvil of machine 1200, or any other desired support structure). In the configuration shown in FIG. 12A (preparing for bonding), each of upper conductive structures 1212*a*, 1212*b* are generally aligned with opposing respective lower conductive structures 1206*a*, 1206*b*. Semiconductor element 1208 is moved downward through the motion of bonding tool 1224 (as shown by the arrows 1226 in FIG. 12A). Following this motion, FIG. 12B illustrates contact between the respective conductive structures 1206*a* (including coating 1206*a*1), 1212*a* (including coating 1212*a*1) and 1206*b* (including coating 1206*b*1), 1212*b* (including coating 1212*b*1). Ultrasonic energy 1214 is applied to upper semiconductor element 1208 and upper conductive structures 1212*a*, 1212*b* through bonding tool 1224 using an ultrasonic transducer (not shown but indicated in the drawings as "USG", that is, ulrasonic generator). For example, an ultrasonic transducer that carries bonding tool 1224 may in turn be carried by a bond head assembly of machine 1200. During the ultrasonic bonding, lower conductive structures 1206*a*, 1206*b* may be held relatively stationary through the support of lower semiconductor element 1260 by support structure 1250 (e.g., a support surface of support structure 1250 may include one or more vacuum ports to secure substrate 1204 to support structure 1250 during bonding).

Ultrasonic energy 1214 (along with optional bond force and/or heat) may cause partial deformation of the conductive structures. For example, conductive structures 1206a, 1206b and 1212a, 1212b are illustrated as being deformed (or at least partially deformed) in FIG. 12C. Ultrasonic bonds are formed between respective pairs of conductive structures in FIG. 12C. For example, ultrasonic bond 1228a is formed between deformed conductive structures 1212a'/1206a', and ultrasonic bond 1228b is formed between deformed conductive structures 1212b'/1206b'.

Referring specifically to FIG. 13, at Step 1300, a first semiconductor element (e.g., including a semiconductor die on a substrate, such as element 1260 shown in FIG. 12A) is supported on a support structure of a bonding machine. The first semiconductor element (e.g., an upper surface of the semiconductor structure) includes a plurality of first conductive structures including a coating on a contact surface of the conductive structures (see, e.g., structures 1206a, 1206b of element 1260, including coatings 1206a1, 1206b1, as shown in FIG. 12A). At Step 1302, a second semiconductor element is retained by a holding portion of a bonding tool of the bonding machine (see, e.g., element 1208 in FIG. 12A). The second semiconductor element includes a plurality of second conductive structures (e.g., on a lower surface of the second semiconductor element), including a coating on a contact portion of the conductive structures (see, e.g., structures 1212a, 1212b of element 1208, including coatings 1212a1, 1212b1, as shown in FIG. 12A). At Step 1304, the first conductive structures and the second conductive structures are aligned with one another (see, e.g., FIG. 12A) and are then brought into contact with one another. At Step 1306, ultrasonic energy is applied to the second semiconductor element (through a bonding tool carrying the second semiconductor element, such as in FIG. 12B), such that the conductive structures of the second semiconductor element break through respective coatings of the conductive structures of the first semiconductor element (and vice versa, that is, the conductive structures of the first semiconductor element break through respective coatings of the conductive structures of the second semiconductor element) in connection with the formation of ultrasonic bonds between the pairs of conductive structures (e.g., see ultrasonic bonds 1228a, 1228b in FIG. 12C).

The respective pairs of conductive elements (806a, 812a and 806b, 812b in FIG. 8A; 1006a, 1012a and 1006b, 1012b in FIG. 10A; and 1206a, 1212a and 1206b, 1212b in FIG. 12A) may be bonded together at room temperature (without heat being added during the bonding process). Optionally, heat may be applied, for example, to: (1) the upper semiconductor element 808/1008/1012 through bonding tool 824/1024/1224, thus heating the respective upper conductive elements during the bonding process; and/or (2) lower semiconductor element 860/1060/1260 through the support structure 850/1050/1250, thus heating the respective lower conductive structures during the bonding process. Such optional heating (e.g., through the bond tool and/or the support structure, etc.) is applicable to any of the embodiments of the invention illustrated and described herein.

Further, during the bonding processes (e.g., the processes shown and described in connection with FIGS. 8A-8C, 10A-10C, and 12A-12C), the plurality of first conductive structures and second conductive structure may be pressed together with a predetermined amount of bond force. The predetermined amount of bond force may be a single bond force value, or may be a bond force profile where the actual bond force is varied during the flip chip bonding operation.

Regardless of the specific elements described above, semiconductor elements 860, 808 (in FIGS. 8A-8C), 1060, 1008 (in FIGS. 10A-10C), and 1260, 1208 (in FIGS. 12A-12C) may be any of a number of semiconductor elements configured to be bonded together (e.g., a memory device configured to be bonded to a processor). For example, the lower semiconductor element (860, 1060, 1260) may be a semiconductor die, a wafer, a panel, a substrate, amongst many other possible elements configured to receive an upper semiconductor element (e.g., a die) during a flip chip bonding process.

The conductive structures (i.e., 812a, 812b, 806a, 806b in FIGS. 8A-8C; 1012a, 1012b, 1006a, 1006b in FIGS. 10A-10C; and 1212a, 1212b, 1206a, 1206b in FIGS. 12A-12C) are illustrated as generic structures. These structures may take many different forms such as conductive pillars, stud bumps (e.g., formed using a stud bumping machine), electroplated conductive structures, sputtered conductive structures, wire portions, bond pads, contact pads, among many others. Various of the other drawings provided herein illustrate specific examples of such structures. In accordance with certain embodiments of the invention, the conductive structures may be formed of copper, or include copper, or some other material subject to oxidation, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of ultrasonically bonding semiconductor elements, the method comprising the steps of:
   (a) aligning surfaces of a plurality of second conductive structures of a second semiconductor element to respective surfaces of a plurality of first conductive structures of a first semiconductor element, wherein a bonding surface of at least one of the first conductive structures and the second conductive structures includes a frangible coating; and
   (b) ultrasonically bonding ones of the second conductive structures to respective ones of the first conductive structures.

2. The method of claim 1 wherein the first semiconductor element is a semiconductor die.

3. The method of claim 1 wherein each of the first semiconductor element and the second semiconductor element is a respective semiconductor die.

4. The method of claim 1 wherein the first semiconductor element includes a semiconductor die.

5. The method of claim 1 wherein each of the first semiconductor element and the second semiconductor element includes a respective semiconductor die.

6. The method of claim 1 further comprising the step of moving the second semiconductor element towards the first semiconductor element such that lower surfaces of the second conductive structures contact upper surfaces of the respective first conductive structures.

7. The method of claim 1 further comprising the step of applying pressure between the first semiconductor element and the second semiconductor element during at least a portion of step (b).

8. The method of claim 1 further comprising the step of deforming ones of the second conductive structures during step (b).

9. The method of claim 1 wherein step (b) is conducted at ambient temperature.

10. The method of claim 1 further comprising the step of heating at least one of the first semiconductor element and the second semiconductor element during at least a portion of step (b).

11. The method of claim 1 further comprising the step of heating the second semiconductor element, during at least a portion of step (b), using a bonding tool that retains the second semiconductor element.

12. The method of claim 1 further comprising the step of heating the first semiconductor element, during at least a portion of step (b), using a support structure that supports the first semiconductor element during step (b).

13. The method of claim 1 wherein at least one of the plurality of first conductive structures and the plurality of second conductive structures is formed of copper.

14. The method of claim 1 wherein each of the plurality of first conductive structures and the plurality of second conductive structures is a copper conductive structure.

15. The method of claim 1 wherein at least one of the plurality of first conductive structures and the plurality of second conductive structures includes copper at an interface portion adjacent the other of the plurality of first conductive structures and the plurality of second conductive structures.

16. The method of claim 1 wherein step (b) includes ultrasonically bonding the ones of the second conductive structures to the respective ones of the first conductive structures using a bonding tool that retains the second semiconductor element during step (b).

17. The method of claim 16 wherein the bonding tool is engaged with an ultrasonic transducer for providing ultrasonic energy during step (b).

18. The method of claim 16 wherein the bonding tool retains the second semiconductor element during step (b) using vacuum.

19. The method of claim 1 wherein the coating is a ceramic coatings.

20. The method of claim 1 wherein the coating is a surface layer of a nitride, oxide or carbide of silicon, or a mixture thereof.

21. The method of claim 1 wherein the coating has a thickness between 10 angstroms and 500 angstroms.

22. The method of claim 1 wherein the coating has a thickness between 15 angstroms and 250 angstroms.

23. A method of ultrasonically bonding semiconductor elements, the method comprising the steps of:

(a) aligning surfaces of a plurality of second conductive structures of a second semiconductor element to respective surfaces of a plurality of first conductive structures of a first semiconductor element, the first semiconductor element being supported by a support structure of a bonding machine, the second semiconductor element being carried by a bonding tool of the bonding machine, wherein a bonding surface of the first conductive structures includes a frangible coating; and (b) ultrasonically bonding ones of the second conductive structures to respective ones of the first conductive structures using the bonding tool.

24. A method of ultrasonically bonding semiconductor elements, the method comprising the steps of:

(a) aligning surfaces of a plurality of second conductive structures of a second semiconductor element to respective surfaces of a plurality of first conductive structures of a first semiconductor element, the first semiconductor element being supported by a support structure of a bonding machine, the second semiconductor element being carried by a bonding tool of the bonding machine, wherein a bonding surface of the second conductive structures includes a frangible coating; and (b) ultrasonically bonding ones of the second conductive structures to respective ones of the first conductive structures using the bonding tool.

25. A method of ultrasonically bonding semiconductor elements, the method comprising the steps of:

(a) aligning surfaces of a plurality of second conductive structures of a second semiconductor element to respective surfaces of a plurality of first conductive structures of a first semiconductor element, the first semiconductor element being supported by a support structure of a bonding machine, the second semiconductor element being carried by a bonding tool of the bonding machine, wherein a bonding surface of each of the first conductive structures and the second conductive structures includes a frangible coating; and (b) ultrasonically bonding ones of the second conductive structures to respective ones of the first conductive structures using the bonding tool.

* * * * *